United States Patent
Nakanishi et al.

(10) Patent No.: US 8,415,682 B2
(45) Date of Patent: Apr. 9, 2013

(54) LIGHT EMITTING SEMICONDUCTOR DEVICE HAVING AN IMPROVED OUTWARD LUMINOSITY EFFICIENCY AND FABRICATION METHOD FOR THE LIGHT EMITTING SEMICONDUCTOR DEVICE

(75) Inventors: Yasuo Nakanishi, Kyoto (JP); Masayuki Sonobe, Kyoto (JP); Kazuaki Tsutsumi, Kyoto (JP)

(73) Assignee: Rohm Co., Ltd., Kyoto-shi, Kyoto-fu (JP)

( * ) Notice: Subject to any disclaimer, the term of this patent is extended or adjusted under 35 U.S.C. 154(b) by 875 days.

(21) Appl. No.: 12/318,118

(22) Filed: Dec. 22, 2008

(65) Prior Publication Data

US 2009/0166608 A1    Jul. 2, 2009

(30) Foreign Application Priority Data

Dec. 28, 2007  (JP) ................................ 2007-340469
Jan. 16, 2008  (JP) ................................ 2008-006943
Nov. 28, 2008  (JP) ................................ 2008-304190

(51) Int. Cl.
*H01L 27/00* (2006.01)

(52) U.S. Cl. .......................... 257/79; 257/190

(58) Field of Classification Search .............. 257/79, 257/190, 11, 88, E21.119
See application file for complete search history.

(56) References Cited

U.S. PATENT DOCUMENTS

| 6,586,777 | B1 * | 7/2003 | Yuasa et al. | 257/103 |
| 6,870,191 | B2 * | 3/2005 | Niki et al. | 257/79 |
| 7,087,930 | B2 * | 8/2006 | Senda et al. | 257/79 |
| 7,683,386 | B2 * | 3/2010 | Tanaka et al. | 257/88 |

FOREIGN PATENT DOCUMENTS

| JP | 10-284802 A | 10/1998 |
| JP | 2004-055719 A | 2/2004 |
| JP | 2007-184411 | 7/2007 |
| JP | 2007-243074 | 9/2007 |

OTHER PUBLICATIONS

Akira Sakai and Akira Usui, "Reduction of Dislocation Destiny by GaN Selection Epitaxial Lateral Overgrowth", Applied Physics, vol. 68, No. 7, pp. 774-779 (1999).

* cited by examiner

*Primary Examiner* — Howard Weiss
*Assistant Examiner* — Steven Rao
(74) *Attorney, Agent, or Firm* — Rabin & Berdo, P.C.

(57) ABSTRACT

A semiconductor light emitting device and a fabrication method for the semiconductor light emitting device whose outward luminous efficiency improved are provided and the semiconductor light emitting device includes a substrate; a protective film placed on the substrate; an n-type semiconductor layer which is placed on the substrate pinched by a protective film and on the protective film, and is doped with an n-type impurity; an active layer placed on the n-type semiconductor layer, and a p-type semiconductor layer placed on the active layer and is doped with a p-type impurity.

16 Claims, 18 Drawing Sheets 100  15  2 200

LIGHT EMITTING SEMICONDUCTOR DEVICE HAVING AN IMPROVED OUTWARD LUMINOSITY EFFICIENCY AND FABRICATION METHOD FOR THE LIGHT EMITTING SEMICONDUCTOR DEVICE

CROSS REFERENCE TO RELATED APPLICATION AND INCORPORATION BY REFERENCE

This application is based upon and claims the benefit of priority from prior Japanese Patent Applications No. P2007-340469 filed on Dec. 28, 2007, No. P2008-006943 filed on Jan. 16, 2008, and No. P2008-304190 filed on Nov. 28, 2008, the entire contents of which are incorporated herein by reference.

BACKGROUND OF THE INVENTION

1. Field of the Invention

The present invention relates to a semiconductor light emitting device and a fabrication method for the semiconductor light emitting device. In particular, the present invention relates a semiconductor light emitting device and a fabrication method for the semiconductor light emitting device for improving outward luminous efficiency.

2. Description of the Related Art

The semiconductor light emitting device which composes a III group nitride based semiconductor is used for an LED (Light Emitting Diode) etc. As an example of the III group nitride based semiconductor, there are aluminum nitride (AlN), gallium nitride (GaN), indium nitride (InN), etc. A typical III group nitride based semiconductor is expressed with $Al_xIn_yGa_{1-x-y}N$ (where $0<=x<=1$, $0<=y<=1$, $0<=x+y<=1$).

The semiconductor light emitting device using the III group nitride based semiconductor has a structure layered by n-type III group nitride based semiconductor layer (n-type semiconductor layer), active layer (luminous layer), and p-type III group nitride based semiconductor layer (p-type semiconductor layer) on the substrate at this order, for example. And the light which a hole supplied from the p-type semiconductor layer and an electron supplied from the n-type semiconductor layer recombine and generate in the active layer is outputted external (for example, refer to Patent Documents 1).

As the active layer, a MQW (Multiple Quantum Well) structure which sandwiched a plurality of layer by a well layer in the shape of sandwiches by the barrier layer with a greater band gap than the well layer is adoptable (for example, refer to Patent Documents 2).

In an MOVPE (Metal Organic Vapor Phase Epitaxy) method, the dislocation density of GaN obtained by using AlN or a GaN low temperature buffer layer on a sapphire substrate is about $10^8$ to $10^{10}$ $cm^{-2}$. On creating devices, such as a semiconductor laser, not more than about $10^6$ $cm^{-2}$ are needed. The dislocation, which is a problem, is penetration dislocation inherited with crystal growth from an interfacial region with the sapphire substrate.

Currently, a technology established as an effective method of reducing dislocation density to about $10^6$ to $10^7$ $cm^{-2}$ is an ELO (Epitaxial Lateral Overgrowth) technology which employed the characteristics of selective ELO efficiently.

There are the ELO technologies based on an HVPE (Hydride Vapor Phase Epitaxy) method and an MOVPE method for the ELO technology applied to GaN. It is the characteristic that the HVPE method can take a large growth rate in several 10 to several 100 micrometer/h.

The method of being based on the HVPE method is called FIELO (Facet-Initiated Epitaxial Lateral Overgrowth). In the FIELO, the thing formed the stripe shape mask pattern of $SiO_2$ with lithography is used as a substrate, for example on GaN with a thickness of 1 to 1.5 micrometers grown up with the MOVPE method on the sapphire (0001) surface (c surface). That is, in the semiconductor light emitting device, first of all, an about several micrometers n-type GaN layer is grown epitaxially on a sapphire substrate, then, an $SiO_2$ film or a $SiN_x$ film is formed partially on an n-type GaN layer, and then, the n-type semiconductor layer is formed for n-type GaN layers except the $SiO_2$ or the $SiN_x$ film with selective ELO as a seed crystal of the selective ELO (for example, refer to Non-Patent Document 1).

However, if the n-type GaN layer having a refractive index which is greatly different from the value of a refractive index of the sapphire substrate to the down side of the $SiO_2$ film or the $SiN_x$ film having a refractive index near the value of the refractive index of the sapphire substrate is located, a reflection of light occurs by the interface between the sapphire substrate and the n-type GaN layer, and light of the semiconductor light emitting device cannot be extracted external effectively, thereby the outward luminous efficiency reduces.

In the structure, when fabricating a nitride based semiconductor by an MOCVD (Metal Organic Chemical Vapor Deposition), for example, by using a sapphire substrate as a substrate for growth, metal organic compound gas was supplied as reactant gas, and the GaN epitaxial growth layer was formed on the sapphire substrate for crystal growth temperature at high temperature about 900 degrees C. to 1100 degrees C. The surface morphology of the GaN semiconductor layer by which direct growth is performed on the sapphire substrate by using the MOCVD method is very wrong. Then, before growing up the GaN semiconductor layer, a method of forming a buffer layer of AlN on the sapphire substrate is used. However, the growing condition of the buffer layer is limited severely, and also the described method needs to control film thickness strictly to 100 to 500 Å (angstrom) at the very thin range. Moreover, when performing crystal growth of the GaN layer on the AlN buffer layer, lattice constant mismatching is remarkable.

Moreover, when forming the p-type semiconductor layer in multilayer structure, in order to reduce the heat damage to an active layer, it is necessary to perform low-temperature growth, and it is necessary to reduce forward voltage ($V_f$) and to improve luminous efficiency simultaneously. Moreover, when applying the GaN layer as the p-type semiconductor layer, there is a problem in respect of a transparency over a luminous wavelength.

Moreover, as for the number of pairs of MQW, 4 to 5 pairs are used in the structure. In this case, an electron supplied from the n-type semiconductor layer jumps over the active layer, and flows to the p-type semiconductor layer. On this occasion, before a hole supplied from the p-type semiconductor layer reaches the active layer, the hole recombines with the electron, and the hole concentration which reaches the active layer decreases. Thereby, the luminance of LED will decrease. In order to prevent this phenomenon, a structure, which inserts the p-type AlGaN layer with a large band gap in front of the p-type semiconductor layer, is used. However, if aluminum (Al) is introduced, performing the p-type becomes difficult, and a value of resistance rises. On the other hand, when applying an InGaN layer to the well layer of the active layer, there is a problem that it is weak to the heat damage accompanying the high temperature process in formation of the p-type semiconductor layer.

Patent Document 1: Japanese Patent Application Laying-Open Publication No. H10-284802

Patent Document 2: Japanese Patent Application Laying-Open Publication No. 2004-55719

Non-Patent Document 1: SAKAI Akira, and USUI Akira, "REDUCTION OF DISLOCATION DENSITY BY GaN SELECTION EPITAXIAL LATERAL OVER-GROWTH", Monthly Publication of the Japan Society of Applied Physics, Vol. 68, No. 7, pp. 774-779 (1999)

SUMMARY OF THE INVENTION

According to one aspect of the present invention, a semiconductor light emitting device comprises a substrate; a protective film placed on the substrate; an n-type semiconductor layer placed on the substrate pinched by the protective film and on the protective film, and doped with an n-type impurity; an active layer placed on the n-type semiconductor layer; and a p-type semiconductor layer placed on the active layer and doped with a p-type impurity.

According to another aspect of the present invention, a semiconductor light emitting device comprises a substrate; a protective film placed on the substrate; an AlN buffer layer placed on the substrate pinched by the protective film; an n-type semiconductor layer placed on the AlN buffer layer and the protective film, and doped with an n-type impurity; a block layer placed on the n-type semiconductor layer, and doped with an n-type impurity by concentration lower than the n-type semiconductor layer; an active layer placed on the block layer, the active layer being composed of a MQW having a layered structure by which an barrier layer and a well layer in which a band gap is smaller than the barrier layer is placed by turns, and including indium; a first nitride based semiconductor layer placed on the active layer and doped with a p-type impurity; a second nitride based semiconductor layer placed on the first nitride based semiconductor layer, and doped with a low-concentration p-type impurity rather than the p-type impurity of the first nitride based semiconductor layer; a third nitride based semiconductor layer that is placed on the second nitride based semiconductor layer, and doped with a high-concentration p-type impurity rather than the p-type impurity of the second nitride based semiconductor layer; and a fourth nitride based semiconductor layer placed on the third nitride based semiconductor layer, and doped with a low-concentration p-type impurity rather than the p-type impurity of the third nitride based semiconductor layer, wherein the film thickness of a final barrier layer of the top layer of the layered structure is thicker than a diffusion length of the p-type impurity of the first nitride based semiconductor layer.

According to another aspect of the present invention, a semiconductor light emitting device comprises a substrate; a protective film placed on the substrate; an AlN buffer layer placed on the substrate pinched by the protective film; an n-type semiconductor layer placed on the AlN buffer layer and the protective film, and doped with an n-type impurity; a block layer placed on the n-type semiconductor layer, and doped with the n-type impurity by concentration lower than the n-type semiconductor layer; an active layer placed on the block layer, the active layer being composed of a MQW having a layered structure by which an barrier layer and a well layer in which a band gap is smaller than the barrier layer is placed by turns, and including indium; a first nitride based semiconductor layer placed on the active layer and doped with a p-type impurity; a second nitride based semiconductor layer placed on the first nitride based semiconductor layer, and doped with a low-concentration p-type impurity rather than the p-type impurity of the first nitride based semiconductor layer; and a transparent electrode placed on the second nitride based semiconductor layer, and composed of a transparent electrode, wherein the film thickness of a final barrier layer of the top layer of a layered structure is thicker than a diffusion length of the p-type impurity of the first nitride based semiconductor layer.

According to another aspect of the present invention, a semiconductor light emitting device comprises a substrate; an AlN buffer layer placed on the substrate; an n-type semiconductor layer placed on the AlN buffer layer, and composed of an $Al_xGa_{1-x}N$ layer (where $0<x<1$) doped with an n-type impurity; an active layer placed on the n-type semiconductor layer, the active layer composed of a MQW having a layered structure by which the well layer composed of a barrier layer composed of an $Al_xGa_{1-x}N$ layer (where $0<x<1$) and an $Al_xIn_yGa_{1-x-y}N$ layer (where $0<x<=y<1$, $0<x+y<1$) in which a band gap is smaller than the barrier layer are placed by turns; and a p-type semiconductor layer placed on the active layer, and composed of an $Al_xGa_{1-x}N$ layer (where $0<=x<1$) doped with a p-type impurity.

According to another aspect of the present invention, a fabrication method for a semiconductor light emitting device comprises forming a protective film on a substrate; patterning the protective film and exposing the substrate; forming an n-type semiconductor layer doped with an n-type impurity with an ELO on the substrate pinched by the protective film and on the protective film; forming an active layer on the n-type semiconductor layer; and forming a p-type semiconductor layer doped with a p-type impurity on the active layer.

According to another aspect of the present invention, a fabrication method for a semiconductor light emitting device comprises forming an AlN buffer layer on a substrate; forming an n-type semiconductor layer composed of an $Al_xGa_{1-x}N$ layer (where $0<x<1$) doped with of an n-type impurity on the AlN buffer layer; forming an active layer composed of a MQW having a layered structure by which the well layer composed of a barrier layer composed of an $Al_xGa_{1-x}N$ layer (where $0<x<1$) and an $Al_xIn_yGa_{1-x-y}N$ layer (where $0<x<=y<1$, $0<x+y<1$) in which a band gap is smaller than the barrier layer are placed by turns; and forming a p-type semiconductor layer composed of an $Al_xGa_{1-x}N$ layer (where $0<=x<1$) doped with a p-type impurity on the active layer.

According to the present invention, a semiconductor light emitting device whose outward luminous efficiency improved, and a fabrication method for the same can be provided.

Moreover, according to the present invention, a semiconductor light emitting device and a fabrication method for the semiconductor light emitting device which is doped with Al to a n-type semiconductor layer, an active layer, and a p-type semiconductor layer, and a heat damage is decreased, and is improved of the transparency over a luminous wavelength and whose outward luminous efficiency improved can be provided.

DETAILED DESCRIPTION OF THE EMBODIMENTS

Figure 1A:
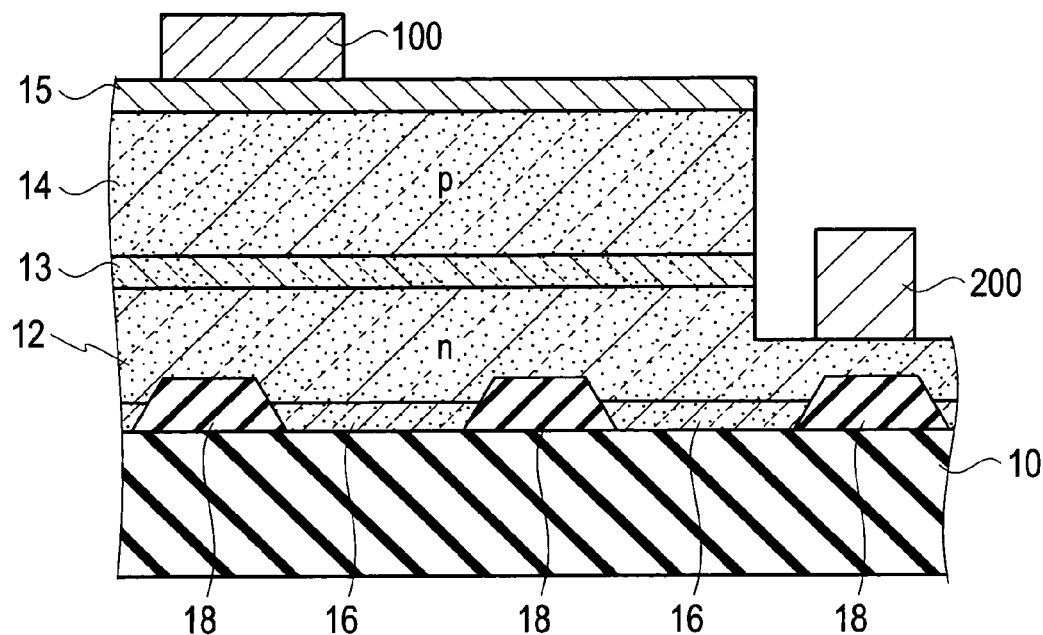
FIG. 1A is a schematic cross-sectional configuration chart of a semiconductor light emitting device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is in the representation of the cross-sectional diagram, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific material layers, etc. to provide a thorough understanding of the present invention. However, it will be obvious to those skilled in the art that the present invention may be practiced without such specific details. In other instances, the material layers well-known have been shown in the cross-sectional diagrams form in order to not obscure the present invention with unnecessary detail. Drawings are schematic, not actual, and may be inconsistent in between in scale, ratio, etc.

The embodiments shown below exemplify a semiconductor device that are used to implement the technical ideas according to the present invention, and do not limit the technical ideas according to the present invention to those that appear below. These technical ideas, according to the present invention, may receive a variety of modifications that fall within the claims.

In a semiconductor emission device(s) according to the following embodiments of the invention, "transparent" is defined as that whose transmissivity is not less than about 50%. In the semiconductor emission device(s) according to the embodiments of the invention, the "transparent" is used for the purpose of being transparent and colorless toward visible light. The visible light is equivalent to the wavelength of about 360 nm to about 830 nm, and about 3.4 eV to about 1.5 eV of energies, and if the visible light does not cause absorption, reflection and dispersion in this region, it is transparent.

The transparency is determined by a band gap $E_g$ and a plasma frequency $\omega_p$. When the band gap $E_g$ is not less than about 3.1 eV, since an inter band transition of an electron does not occur with the visible light, it passes through without absorbing visible light. On the other hand, since the light of energy lower than plasma frequency $\omega_p$ cannot advance into the inside of plasma, it is reflected by the carrier considered that is plasma. The plasma frequency $\omega_p$ is expressed with $\omega_p = (nq^2/\in m^*)^{1/2}$ (where n denotes carrier density, q denotes an electric charge, $\in$ denotes a dielectric constant, and m* denotes effective mass), and is a function of carrier density.

First Embodiment (Element Structure)

Figure 1B:
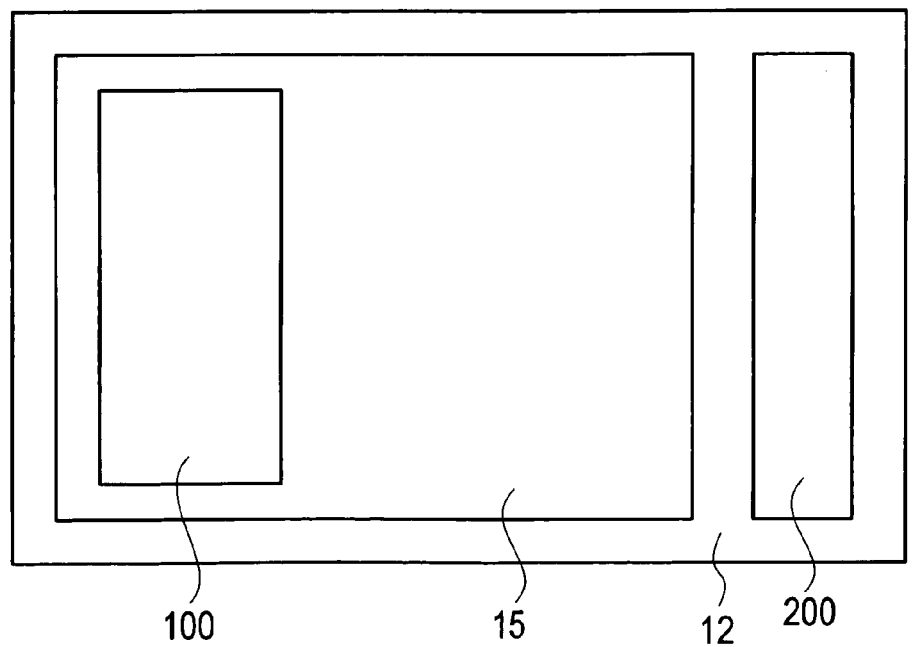
FIG. 1B is a schematic plane pattern configuration diagram of the semiconductor light emitting device according to the first embodiment of the present invention.

A semiconductor light emitting device according to the first embodiment of the present invention includes a substrate 10, a protective film 18, an n-type semiconductor layer 12, an active layer 13, and a p-type semiconductor layer 14, as shown in FIG. 1A and FIG. 1B. The protective film 18 is placed on the substrate 10. The n-type semiconductor layer 12 is placed on the substrate 10 pinched by the protective film 18 and on the protective film 18, and is doped with an n-type impurity. The active layer 13 is placed on the n-type semiconductor layer 12. The p-type semiconductor layer 14 is placed on the active layer 13, and is doped with a p-type impurity.

Moreover, a buffer layer 16 located on the substrate 10 pinched by the protective film 18 may be further provided.

Moreover, the semiconductor light emitting device according to the first embodiment includes a transparent electrode 15, an n-side electrode 200, and a p-side electrode 100, as shown in FIG. 1A and FIG. 1B. The transparent electrode 15 is placed on the p-type semiconductor layer 14. The n-side electrode 200 is placed on the surface of the n-type semiconductor layer 12 obtained by removing a part of the transparent electrode 15, the p-type semiconductor layer 14, the active layer 13, and the n-type semiconductor layer 12. The p-side electrode 100 is placed on the transparent electrode 15.

Figure 10:
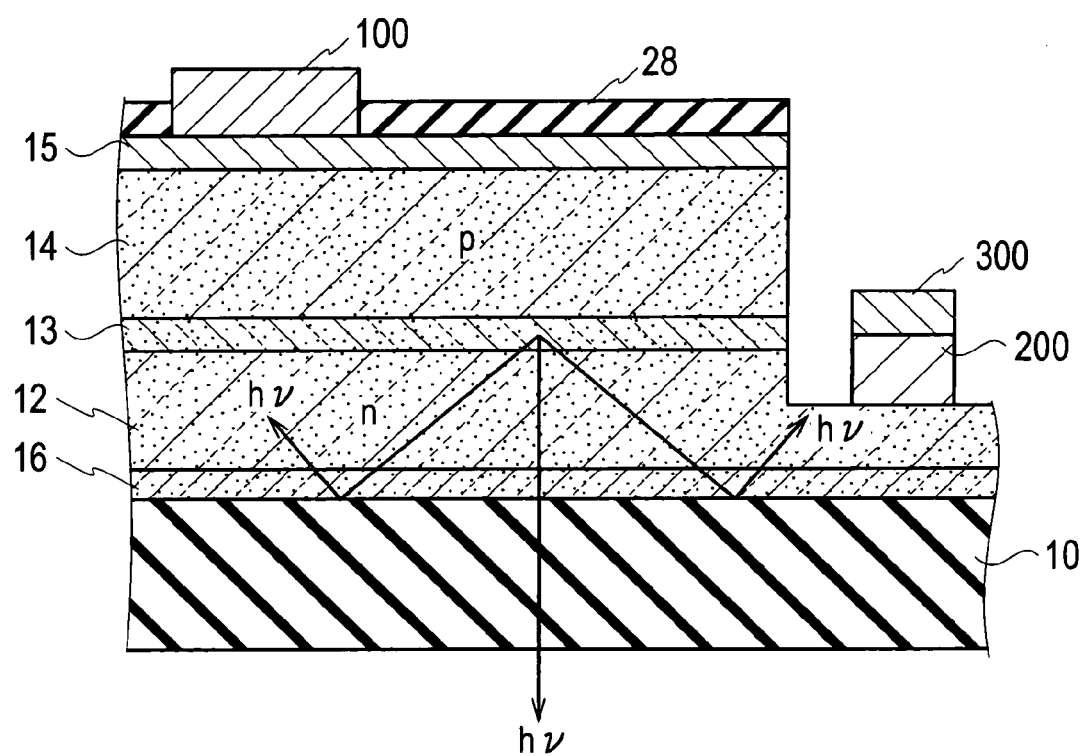
FIG. 10 is a schematic cross-sectional configuration chart of a semiconductor light emitting device according to a comparative example of the present invention compared with FIG. 9.

Moreover, the semiconductor light emitting device according to the first embodiment may be further includes a reflective stacked film 28 located on the transparent electrode 15, as shown in FIG. 10 described later.

The protective film 18 is transparent toward a luminous wavelength, and the refractive index of the protective film 18 is almost equal to the refractive index of the substrate 10. For example, it is effective to use one of the refractive index near the refractive index of the substrate 10 transparently enough toward a luminous wavelength as the protective film 18.

When using a sapphire substrate (n=1.7 to 1.8) as the substrate 10, if an $SiO_2$ film is used as the protective film 18, the refractive index of $SiO_2$ film is about n=1.46, and becomes of the same grade as the refractive index n=1.7 to 1.8 of the sapphire substrate. Moreover, if a $SiN_x$ film is used as the protective film 18, the refractive index of the $SiN_x$ film is about n=2.05, and becomes of the same grade as the refractive index of the sapphire substrate. If a $TiO_x$ film is used as the protective film 18, the refractive index of the $TiO_x$ film is about n=1.8, and becomes of the same grade as the refractive index of the sapphire substrate. Furthermore, if an $Al_2O_3$ film is used as the protective film 18, the refractive index of the $Al_2O_3$ film is about n=1.7 to 1.8, and becomes of the same grade as the refractive index of the sapphire substrate.

Therefore, as the protective film 18, a silicon dioxide film, a silicon nitride film, a silicon oxynitride film, a titanium oxide film, or an alumina film is applicable.

The transparent electrode 15 may be either of ZnO, or ZnO containing ITO or indium.

Or again, as described later, the transparent electrode 15 may be either of ZnO, or ZnO containing ITO or indium, by which impurities of Ga or Al is doped with high impurity concentration of $1 \times 10^{19}$ to $5 \times 10^{21}$ cm$^{-3}$.

Moreover, the active layer 13 has a barrier layer and the layered structure by which the well layer in which the band gap is smaller than a barrier layer placed by turns, and is composed of a MQW including indium.

Moreover, the barrier layer is composed of GaN, the well layer is composed of $In_xGa_{1-x}N$ (where 0<x<1), and the number of pairs of the MQW is about 6 to 11, for example.

Moreover, the thickness of the well layer is 2 to 3 nm, for example, and the thickness of the barrier layer is 15 to 18 nm, for example.

Moreover, the substrates may be c-plane (0001) and the sapphire ($\alpha$-$Al_2O_3$) substrate of 0.25 degree off.

The n-type semiconductor layer 12, the active layer 13, and the p-type semiconductor layer 14 make the nonpolar plane of hexagonal structure to the principal surface of crystal growth, and it is preferable that the lateral over growth surface of the n-type semiconductor layer 12 is a nonpolar plane vertical to the above-mentioned nonpolar plane.

Or again, the n-type semiconductor layer 12, the active layer 13, and the p-type semiconductor layer 14 make m-plane of hexagonal structure to the principal surface of crystal growth, and it is preferable that the lateral over growth surface of the n type semiconductor layer 12 is a-plane vertical to the above-mentioned m-plane.

Or again, the n-type semiconductor layer 12, the active layer 13, and the p-type semiconductor layer 14 make a-plane of hexagonal structure to the principal surface of crystal growth, and it is preferable that the lateral over growth surface of the n-type semiconductor layer 12 is m-plane vertical to the above-mentioned a-plane.

Or again, the n-type semiconductor layer 12, the active layer 13, and the p-type semiconductor layer 14 make the semi-polar plane of hexagonal structure to the principal surface of crystal growth, and it is preferable that the lateral over growth surface of the n-type semiconductor layer 12 is a-plane or m-plane vertical to the above-mentioned semi-polar plane.

Or again, the n-type semiconductor layer 12, the active layer 13, and the p-type semiconductor layer 14 make the polar face of hexagonal structure to the principal surface of crystal growth, and it is preferable that the lateral over growth surface of the n-type semiconductor layer 12 is m-plane or a-plane.

(Constructional Example Provided with Reflective Stacked Film)

Figure 9:
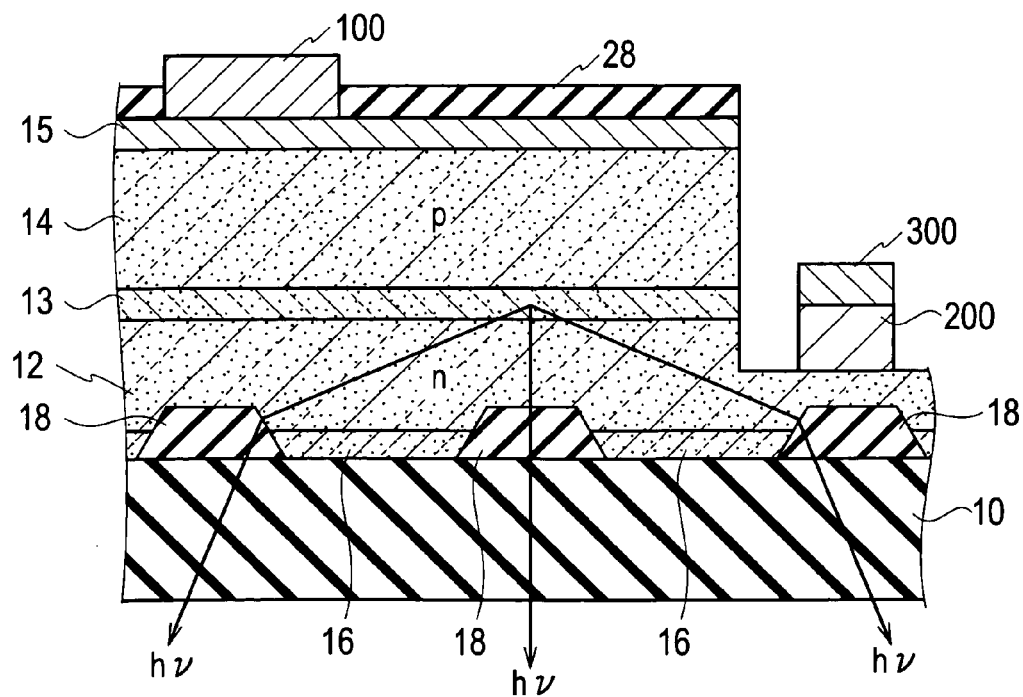
FIG. 9 is a schematic cross-sectional configuration chart of the semiconductor light emitting device according to the first embodiment of the present invention, and is a constructional example provided with a reflective stacked screen.

In the structure of FIG. 1, by placing a reflective stacked film 28 on the transparent electrode 15, the light generated in the active layer 13 can be effectively reflected by the reflective stacked film 28, as shown in FIG. 9.

Furthermore, In the structure of FIG. 9, the light generated in the active layer 13 can be extracted effective in the substrate 10 side with the protective film 18 placed on the substrate 10.

By creating the substrate in which the protective film 18 in which refractive indices differ partially is formed to up to the different species substrate, and also growing a nitride based semiconductor epitaxially to the direct above-mentioned substrate, and forming a light emitting device, unevenness can be formed on the epitaxial growth layer to the substrate interface, dispersion and diffraction of light occur, and optical extraction efficiency improves.

Moreover, since processing of the substrate is unnecessary, there are few burdens also in cost and process, and productivity enhancement is also excellent.

By growing epitaxially directly from a window section of the protective film 18, the epitaxial growing process can be unified at once.

Since ELO is performed so that the protective film 18 may be covered, the penetration dislocation of a crystal can be bent and crystal quality also improves.

On the other hand, in the semiconductor light emitting device according to a comparative example of the present invention compared with FIG. 9, since the difference of the refractive index is large in the interface with the epitaxial growth layer composed of the sapphire substrate 10, the buffer layer 16, or the n-type semiconductor layer 12, as shown in FIG. 10, the angle of total reflection is large. It is because the refractive index of the GaN layer is about n=2.5 in contrast with the refractive index of the sapphire substrate being about n=1.7 to 1.8.

Detailed Constructional Example

Figure 11:
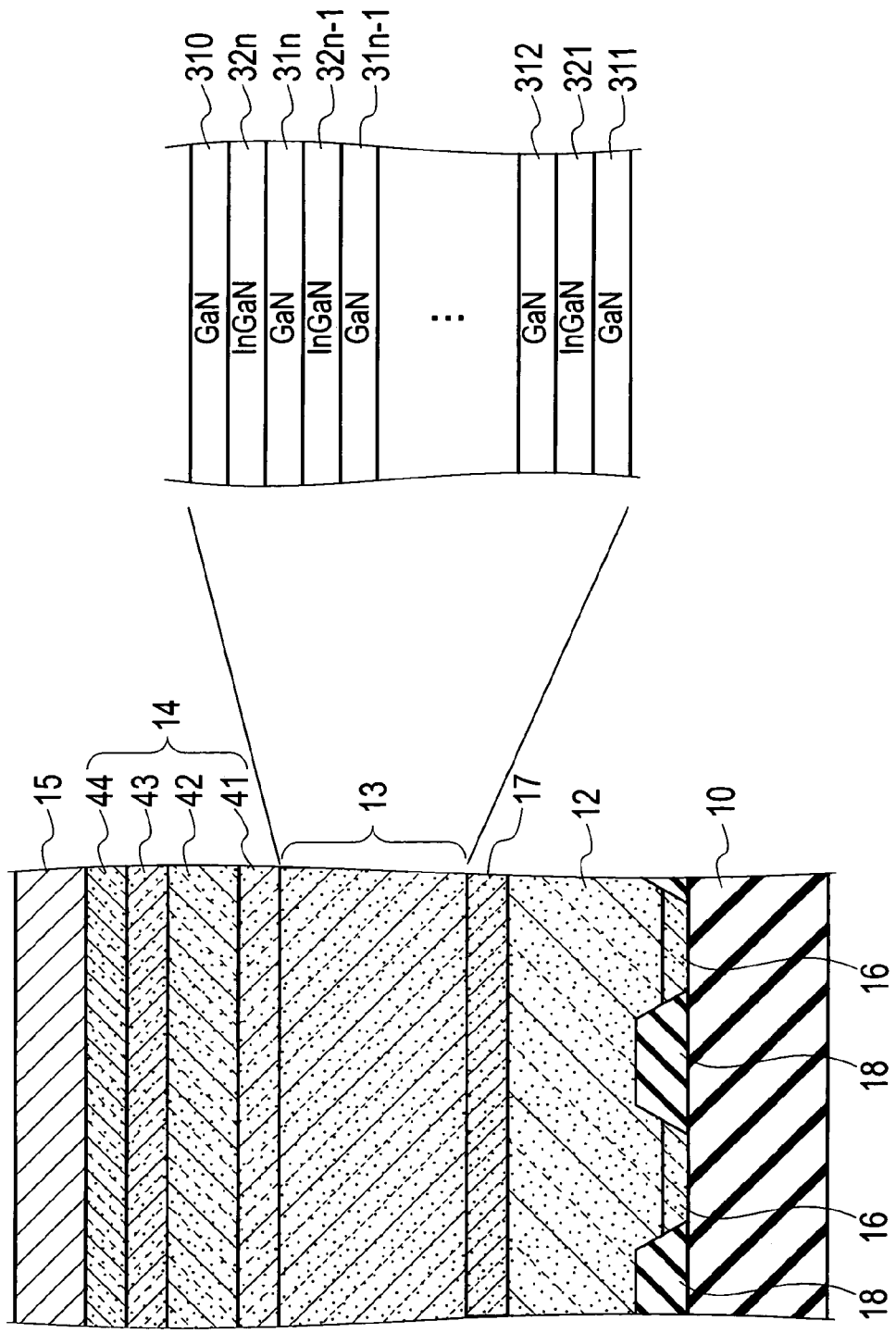
FIG. 11 is a detailed schematic cross-sectional configuration chart of the semiconductor light emitting device according to the first embodiment of the present invention, and is a schematic cross-sectional configuration chart to which a semiconductor light emitting device part and an active layer part are enlarged.

The semiconductor light emitting device according to the first embodiment includes a substrate 10, a protective film 18, a buffer layer 16, an n-type semiconductor layer 12, a block layer 17, an active layer 13, a p-type semiconductor layer 14, and a transparent electrode 15, as shown in FIG. 11. The protective film 18 is placed on the substrate 10. The buffer layer 16 is placed on the substrate 10 pinched by the protective film 18. The n-type semiconductor layer 12 is placed on the buffer layer 16 and the protective film 18, and is doped with the n-type impurity. The block layer 17 is placed on the n-type semiconductor layer 12, and is doped with the n-type impurity by concentration lower than the n-type semiconductor layer 12. The active layer 13 is placed on the block layer 17. The p-type semiconductor layer 14 is placed on the active layer 13. The transparent electrode 15 is placed on the p-type semiconductor layer 14.

As the active layer 13 is shown in FIG. 11, the barrier layers 311 to 31$n$ and 310 and the well layers 321 to 32$n$ in which the band gap is smaller than the barrier layers 311 to 31$n$ and 310 have the layered structure placed by turns. The 1$^{st}$ barrier layer 311 to the n$^{th}$ barrier layer 31$n$ included in the active layer 13 are hereinafter named generically, and are called "barrier layer 31". Moreover, all the well layers included in the active layer 13 are named generically, and are called "well layer 32".

The film thickness of the final barrier layer 310 of the top layer of the above-mentioned layered structure may be formed more thickly than the thickness of other barrier layers (the 1$^{st}$ barrier layer 311 to the n$^{th}$ barrier layer 31$n$) included in the layered structure except the final barrier layer 310.

In the semiconductor light emitting device shown in FIG. 11, the concentration of a p-type dopant of the final barrier layer 310 gradually decreases along to the thickness direction of the final barrier layer 310 from the first principal surface of the final barrier layer 310 which contacts the p-type semiconductor layer 14, and a p-type dopant does not exist in the second principal surface that opposes the first principal surface.

The sapphire substrate of c-plane (0001) and 0.25 degree off, etc. are adoptable as the substrate 10, for example. The n-type semiconductor layer 12, the active layer 13, and the p-type semiconductor layer 14 are composed of the III group nitride based semiconductor, respectively, and the buffer layer 16, the n-type semiconductor layer 12, the block layer 17, the active layer 13, and the p-type semiconductor layer 14 are layered one after another, after forming the protective film 18 on the substrate 10.

(Protective Film)

The protective film 18 needs to be transparent toward a luminous wavelength, and the refractive index of the protective film 18 needs to be a material almost equal to the refractive index of the substrate 10. For example, the protective film is formed with a silicon dioxide film, a silicon nitride film, a silicon oxynitride film, a titanium oxide film, an alumina film, etc.

In the case of a sapphire substrate (n=1.7 to 1.8), $SiO_2$ (n=1.46), $SiN_x$ (n=2.05), $TiO_x$ (n=1.8), $Al_2O_3$ (n=1.7 to 1.8), etc. are applicable as the protective film 18.

As the size of the protective film 18, about 10 micrometers of the width maximum is preferable, and not less than about 100 nm, about 1 micrometer, of the thickness is preferable, for example. The shape of the protective film 18 has effective one of the pattern shape which does not obstruct ELO, such as a triangle, a rhombus, a hexagon, circular, and a stripe. In particular, in order to perform ELO, the direction of the pattern is selected in consideration of a-plane and m-plane which are lateral over growth surfaces.

When extracting light from the back side of the substrate 10, or the upper surface of the epitaxial growth layer, since unevenness occurs on the interface of the protective film 18 and the epitaxial growth layer, the light is scattered or diffracted, and the light total reflection is performed by the interface between the refractive index difference of the epitaxial growth layer and the different species substrate is extracted efficiently outside.

(AlN Buffer Layer)

The buffer layer 16 is formed by an AlN layer about 10 angstroms to 50 angstroms thick, for example. When performing crystal growth of the AlN buffer layer 16, for example, it is made to grow up in the high temperature of a temperature span (about 900 degrees C. to 950 degrees C.).

By supplying trimethyl aluminum (TMA) and ammonia ($NH_3$) to a reaction chamber by applying H2 gas as a carrier, it can form being able to grow up thin AlN buffer layer 16 about 10 to 50 angstrom thick at high speed, and crystal quality also is keeping satisfactory.

According to the semiconductor light emitting device according to the first embodiment, the crystal quality and surface morphology of the III group nitride based semiconductor which are formed on high temperature AlN buffer layer 16 and the protective film 18 are improvable.

(Block Layer)

The III group nitride based semiconductor doped with impurities, for example by less than $1\times10^{17}$ cm$^{-3}$ by using Si as an n-type impurity, whose film thickness is about 200 nm, for example, a GaN layer etc., can be used for the block layer 17 placed between the n-type semiconductor layer 12 and the active layer 13.

In the semiconductor light emitting device shown in FIG. 11, for example, when the impurities doping of the Si is performed about $3\times10^{18}$ cm$^{-3}$ at the n-type semiconductor layer 12, diffusion of Si from the n-type semiconductor layer 12 to the active layer 13 in the formation process of the active layer 13 and the fabricating process after the process can be prevented by placing the block layer 17 by which about $8\times10^{16}$ cm$^{-3}$ impurities of the Si is doped between the n-type semiconductor layer 12 and the active layer 13.

That is, Si is not spread in the active layer 13, thereby the reduction of the luminance of the light generated in the active layer 13 is prevented. Furthermore, when bias is applied between the n-type semiconductor layer 12 and the p-type semiconductor layer 14 in order to make light emit by the active layer 13, the electron supplied to the active layer 13 from the n-type semiconductor layer 12 can prevent the overflow which passes the active layer 13 and reaches the p-type semiconductor layer 14, and the reduction of the luminance of the light outputted from the semiconductor light emitting device can be prevented.

The Si concentration of the block layer 17 is less than $1\times10^{7}$ cm$^{-3}$. This is because the rate of the recombination in the inside of the active layer 13 decreases, and the luminance of the light is generated in the active layer 13 reduces, since the electron supplied from the n-type semiconductor layer 12 overflows to the p-type semiconductor layer 14 exceeding the active layer 13, and recombines with a hole within the p-type semiconductor layer 14, when the Si concentration of the block layer 17 is too high. On the other hand, when the Si concentration of the block layer 17 is too low, carrier density of the electron injected from the n-type semiconductor layer 12 to the active layer 13 cannot be risen. Therefore, it is preferred that the Si concentration of the block layer 17 is less than about $5\times10^{16}$ to $1\times10^{17}$ cm$^{-3}$.

As explained above, according to the semiconductor light emitting device according to the first embodiment, the diffusion of Si from the n-type semiconductor layer 12 to the active layer 13 in the inside of the fabricating process and the overflow of the electron from the n-type semiconductor layer 12 to the p-type semiconductor layer 14 at the time of luminescence can be prevented, and the reduction of the luminance of the light outputted from the semiconductor light emitting device can be prevented, by placing the block layer 17 between the n-type semiconductor layer 12 and the active layer 13. As a result, degradation of the quality of the semiconductor light emitting device shown in FIG. 11 can be prevented.

(N-Type Semiconductor Layer)

The n-type semiconductor layer 12 supplies an electron to the active layer 13, and the p-type semiconductor layer 14 supplies a hole to the active layer 13. When the electron and the hole which are supplied recombine by the active layer 13, the light is generated.

The III group nitride based semiconductor of about 1 to 6 micrometers of the film thickness which performed impurities doping of the n-type impurities, such as silicon (Si), for example, a GaN layer etc., can be used as the n-type semiconductor layer 12.

The n-type semiconductor layer 12 composed of nitride semiconductors through the protective film 18 is directly grown epitaxially to up to the different species substrate 10. In order to bury the protective film 18, conditions are changed into the conditions, which accelerate ELO from the halfway. In order to accelerate ELO, it is effective to change the pressure of the gas series at the time of crystal growth for example. About 1.5 micrometers can be grown up, for example, at about 200 Torr in about 1050 degrees C. as the second step after growth about 1 micrometer, for example, at about 100 Torr in about 1050 degrees C. as the first step. Thus, by forming the n-type semiconductor layer 12, the ELO can be accelerated with the reduction effect of the penetration dislocation density by ELO.

In order to perform the ELO so that the protective film 18 may be covered, the penetration dislocation of the crystal can be bent and crystal quality also improves.

Figure 6:
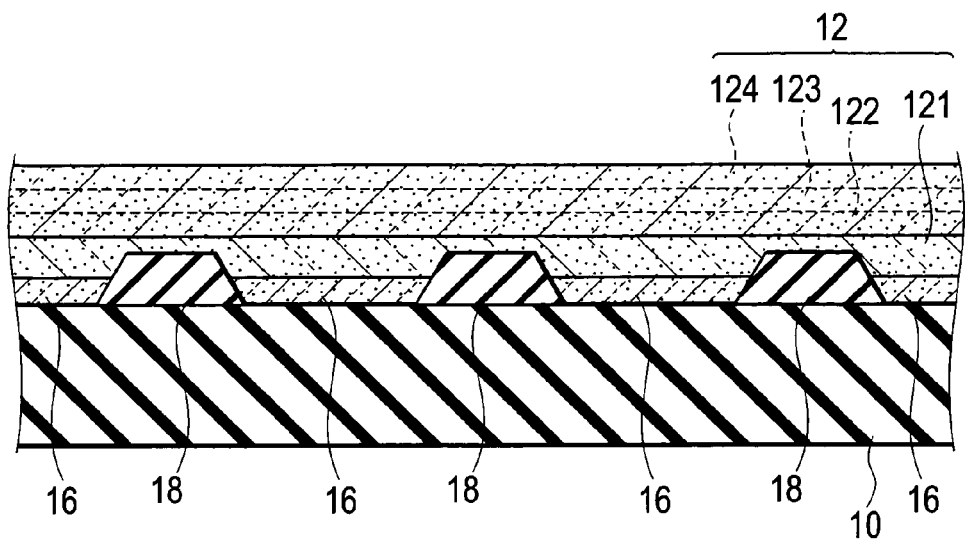
FIG. 6 is a schematic cross-sectional configuration chart for explaining one process of the fabrication method of the semiconductor light emitting device according to the first embodiment of the present invention.

Furthermore, the pressure and the growth temperature conditions which form the n-type semiconductor layer 12 are changed, dividing into the step of several times is also possible, for example, as shown in FIG. 6, the n-type semiconductor layer 12 (121, 122, 123, 124) of 4 tiered structure can also be formed. By doing in this way, the surface morphology of the n-type semiconductor layer 12 is improved, and crystal quality can be improved.

(P-Type Semiconductor Layer)

The III group nitride based semiconductor of about 0.05 to 1 micrometer of the film thickness which performed impurities doping of the p-type impurity, for example, a GaN layer etc., can be used as the p-type semiconductor layer 14. As the p-type impurity, it is usable in magnesium (Mg), zinc (Zn), cadmium (Cd), calcium (Ca), beryllium (Be), carbon (C), etc.

The configuration example of the p-type semiconductor layer 14 is as follows in detail. That is, the p-type semiconductor layer 14 includes a first nitride based semiconductor layer 41, a second nitride based semiconductor layer 42, a third nitride based semiconductor layer 43, and a fourth nitride based semiconductor layer 44, as shown in FIG. 11. The first nitride based semiconductor layer 41 is placed in the upper part of the active layer 13, and doped with a p-type impurity. The second nitride based semiconductor layer 42 is placed on the first nitride based semiconductor layer 41, and doped with a low-concentration p-type impurity rather than the p-type impurity of the first nitride based semiconductor layer 41. The third nitride based semiconductor layer 43 is placed on the second nitride based semiconductor layer 42, and doped with a high-concentration p-type impurity rather than the p-type impurity of the second nitride based semiconductor layer 42. The fourth nitride based semiconductor layer 44 is placed on the third nitride based semiconductor layer 43, and doped with a low-concentration p-type impurity rather than the p-type impurity of the third nitride based semiconductor layer 43.

The thickness of the second nitride based semiconductor layer 42 is formed more thickly than the thickness of the first nitride based semiconductor layer 41 or the thickness of the third nitride based semiconductor layer 43 to the fourth nitride based semiconductor layer 44.

At this point, the material and the thickness of each layer are specifically explained. The first nitride based semiconductor layer 41 which is placed in the upper part of the active layer 13, and doped with the p-type impurity is formed, for example by a p-type GaN layer about 50 nm thick in Mg by about $2\times10^{20}$ cm$^{-3}$ by which impurities doping is performed.

The second nitride based semiconductor layer 42 which is placed on the first nitride based semiconductor layer 41, and doped with the low-concentration p-type impurity rather than the p-type impurity of the first nitride based semiconductor layer 41 is formed, for example by a p-type GaN layer about 100 nm thick in Mg by about $4\times10^{19}$ cm$^{-3}$ by which impurities doping is performed.

The third nitride based semiconductor layer 43 which is placed on the second nitride based semiconductor layer 42, and doped with the high-concentration p-type impurity rather than the p-type impurity of the second nitride based semiconductor layer 42 is formed, for example by a p-type GaN layer about 40 nm thick in Mg by about $1\times10^{20}$ cm$^{-3}$ by which impurities doping is performed.

The fourth nitride based semiconductor layer 44 which is placed on the third nitride based semiconductor layer 43, and doped with the low-concentration p type impurity rather than the p-type impurity of the third nitride based semiconductor layer 43 is formed, for example by a p-type GaN layer about 10 nm thick in Mg by about $8\times10^{19}$ cm$^{-3}$ by which impurities doping is performed.

In the semiconductor light emitting device according to the first embodiment, the p-type semiconductor layer 14 formed on the active layer 13 composed of a MQW including indium is composed of a p-type GaN layer of 4 tiered structure from which Mg concentration differs as mentioned above, and is doped with the above-mentioned concentration. The p-type GaN layer grows at low temperature about 800 degrees C to 900 degrees C in order to reduce the heat damage to the active layer 13.

Since light emitting power becomes high so that Mg concentration is high, the first nitride based semiconductor layer 41 nearest to the active layer 13 is so preferable that Mg concentration is high.

As for the second nitride based semiconductor layer 42, since the crystal defect resulting from Mg increases and membranous resistance becomes high if it performs impurities doping of Mg too much, it is preferable that the Mg concentration is about the middle of the level of $10^{19}$ cm$^{-3}$.

Since the third nitride based semiconductor layer 43 is a layer which determines the amount of hole injections to the active layer 13, its Mg concentration slightly higher than the second nitride based semiconductor layer 42 is preferable.

The fourth nitride based semiconductor layer 44 is a p-type GaN layer for reserving ohmic contact with the transparent electrode 15, and is made depletion substantially. For example, when the ZnO electrode by which impurities doping is performed in Ga or Al about $1\times10^{19}$ to $5\times10^{21}$ cm$^{-3}$ is used as the transparent electrode 15, the impurities doping of Mg is performed at the fourth nitride based semiconductor layer 44 so that it may become Mg concentration at the time when dropping most the forward voltage $V_f$ of the semiconductor light emitting device.

When growing up four layers of the p-type GaN layers, since the third nitride based semiconductor layer 43 and the fourth nitride based semiconductor layer 44 near the p-side electrode 100 need to raise the hole concentration in the film, they increase $H_2$ gas volume in the carrier gas. Moreover, the first nitride based semiconductor layer 41 and the second nitride based semiconductor layer 42 near the active layer 13 do not have to increase the $H_2$ gas volume in the carrier gas, and are made to perform crystal growth by the extension into which the active layer 13 is grown up by the $N_2$ carrier gas. When growing up these p type GaN layers, the way which made the V/III ratio as high as possible can grow up the film which is lower resistance, and can drop the forward voltage $(V_f)$ of the light emitting device.

According to the semiconductor light emitting device according to the first embodiment, the p-type semiconductor layer is formed at low temperature and the heat damage to the active layer can be reduced, and the forward voltage $(V_f)$ can be reduced, thereby the luminous efficiency can be improved.

(Active Layer)

The active layer 13 is the MQW structure of having the $1^{st}$ well layer 321 to the $n^{th}$ well layer $32n$ inserted, respectively by the $1^{st}$ barrier layer 311 to the $n^{th}$ barrier layer $31n$ and the final barrier layer 310, as shown in FIG. 11 (where n is natural number). That is, the active layer 13 is made quantum well structure which sandwiched the well layer 32 in the shape of sandwiches by the barrier layer 31 with a greater band gap than the well layer 32 to a unit pair structure, and has n pair structure which layered this unit pair structure n times.

More specifically, the $1^{st}$ well layer 321 is placed between the $1^{st}$ barrier layer 311 and the $2^{nd}$ barrier layer 312, and the $2^{nd}$ well layer 322 is placed between the $2^{nd}$ barrier layer 312 and the $3^{rd}$ barrier layer 313. And the $n^{th}$ well layer $32n$ is placed between the $n^{th}$ barrier layer $31n$ and the final barrier layer 310. The $1^{st}$ barrier layer 311 of the active layer 13 is placed through the block layer 17 on the n-type semiconductor layer 12, and the p-type semiconductor layer 14 (41 to 44) is placed on the final barrier layer 310 of the active layer 13.

The well layers 321 to $32n$ are formed, for example of an $In_xGa_{1-x}N$ (where $0<x<1$) layer, and the barrier layers 311 to $31n$ and 310 are formed, for example of a GaN layer. Moreover, the number of pairs of the MQW layer is characterized by being 6 to 11, for example. In addition, the ratio $\{x/(1-x)\}$ of indium (In) of the well layers 321 to $32n$ is suitably set up according to the wavelength of light to be generated.

Moreover, the thickness of the well layer 321 to $32n$ is about 2 to 3 nm (preferable about 2.8 nm), for example, and the thickness of the barrier layers 311 to $31n$ is about 7 to 18 nm (preferable about 16.5 nm).

In the semiconductor light emitting device according to the first embodiment, the number of MQW pairs in the active layer 13 for the electron supplied from the n-type semiconductor layer 12 and the hole supplied from the p-type semiconductor layer 14 to recombine efficiently in the active layer 13 can be optimized.

(Final Barrier Layer)

The film thickness of the final barrier layer 310 is formed more thickly than the diffusion length of Mg from the p-type semiconductor layer 14 to the active layer 13.

In the example of the semiconductor light emitting device shown in FIG. 11, the concentration of the p-type impurity of the final barrier layer 310 gradually decreases along the thickness direction of the final barrier layer 310 from the first principal surface of the final barrier layer 310 which contacts the p-type semiconductor layer 14, and the p-type impurity does not exist substantially in the second principal surface that opposes the first principal surface.

The film thickness $d_0$ of the final barrier layer 310 of the semiconductor light emitting device shown in FIG. 11 is set up as that the p-type impurity diffused in the active layer 13 from the p-type semiconductor layer 14 may not reach the well layer 32 of the active layer 13 after the formation process of the p-type semiconductor layer 14 and its process. That is, the film thickness $d_0$ is set as the thickness which the p-type impurity diffused in the final barrier layer 310 from the p-type semiconductor layer 14 does not reach to the second principal surface (surface where the final barrier layer 310 contacts well layer $32n$) that opposes the first principal surface of the final barrier layer 310 which contacts the p-type semiconductor layer 14.

The Mg concentration in the first principal surface of the final barrier layer 310 which contacts the p-type semiconductor layer 14 is, for example about $2\times10^{20}$ cm$^{-3}$, the Mg concentration reduces gradually toward the second principal surface of the final barrier layer 310 which opposes the first principal surface, and the Mg concentration does not have influence of less than about $10^{16}$ cm$^{-3}$ in a position with a distance of about 7 to 8 nm from the first principal surface, thereby becoming not more than the minimum limit of detection community in analysis.

That is, Mg does not diffuse to the second principal surface of the final barrier layer 310 by applying the film thickness $d_0$ of the final barrier layer 310 about 10 nm, and therefore, Mg does not exist in the second principal surface of the final barrier layer 310 which contacts the active layer 13. That is, Mg is not spread in the $n^{th}$ well layer 32$n$, and the reduction of the luminance of the light generated in the active layer 13 is prevented.

In addition, the film thickness d1 to dn of the $1^{st}$ barrier layer 311 to the $n^{th}$ barrier layer 31$n$ may be the same. However, the hole injected into the active layer 13 from the n-type semiconductor layer 12 needs to reach the $n^{th}$ well layer 32$n$, and it is necessary to set the film thickness d1 to dn as the thickness which the electron and luminescence by the recombination of a hole may generate in the $n^{th}$ well layer 32$n$. It is because displacement of the hole in the inside of the active layer 13 is prevented and the luminous efficiency is reduced, if the film thickness d1 to dn of the $1^{st}$ barrier layer 311 to the $n^{th}$ barrier layer 31$n$ is too thick. For example, the film thickness $d_0$ of the final barrier layer 310 is about 10 nm, the film thickness d1 to dn of the $1^{st}$ barrier layer 311 to the $n^{th}$ barrier layer 31$n$ is about 7 to 18 nm, and the film thickness of the $1^{st}$ well layer 321 to the $n^{th}$ well layer 32$n$ is about 2 to 3 nm.

As mentioned above, in the semiconductor light emitting device according to the first embodiment, the film thickness $d_0$ of the final barrier layer 310 which contacts the p-type semiconductor layer 14 is set as the thickness to which the p-type impurity diffused in the active layer 13 from the p-type semiconductor layer 14 does not reach the well layer 32 of the active layer 13. That is, the diffusion of the p-type impurity from the p-type semiconductor layer 14 to the well layer 32 of the active layer 13 can be prevented, controlling increase of the film thickness of the whole of the active layer 13 by setting up more thickly than the diffusion length of Mg the film thickness $d_0$ of the final barrier layer 310, according to the semiconductor light emitting device shown in FIG. 11. As a result, the reduction of the luminance of the light resulting from the diffusion of the p-type impurity to the well layer 32 does not occur, thereby the semiconductor light emitting device by which degradation of the quality of the semiconductor light emitting device is controlled can be fabricated.

Modified Example

Figure 12:
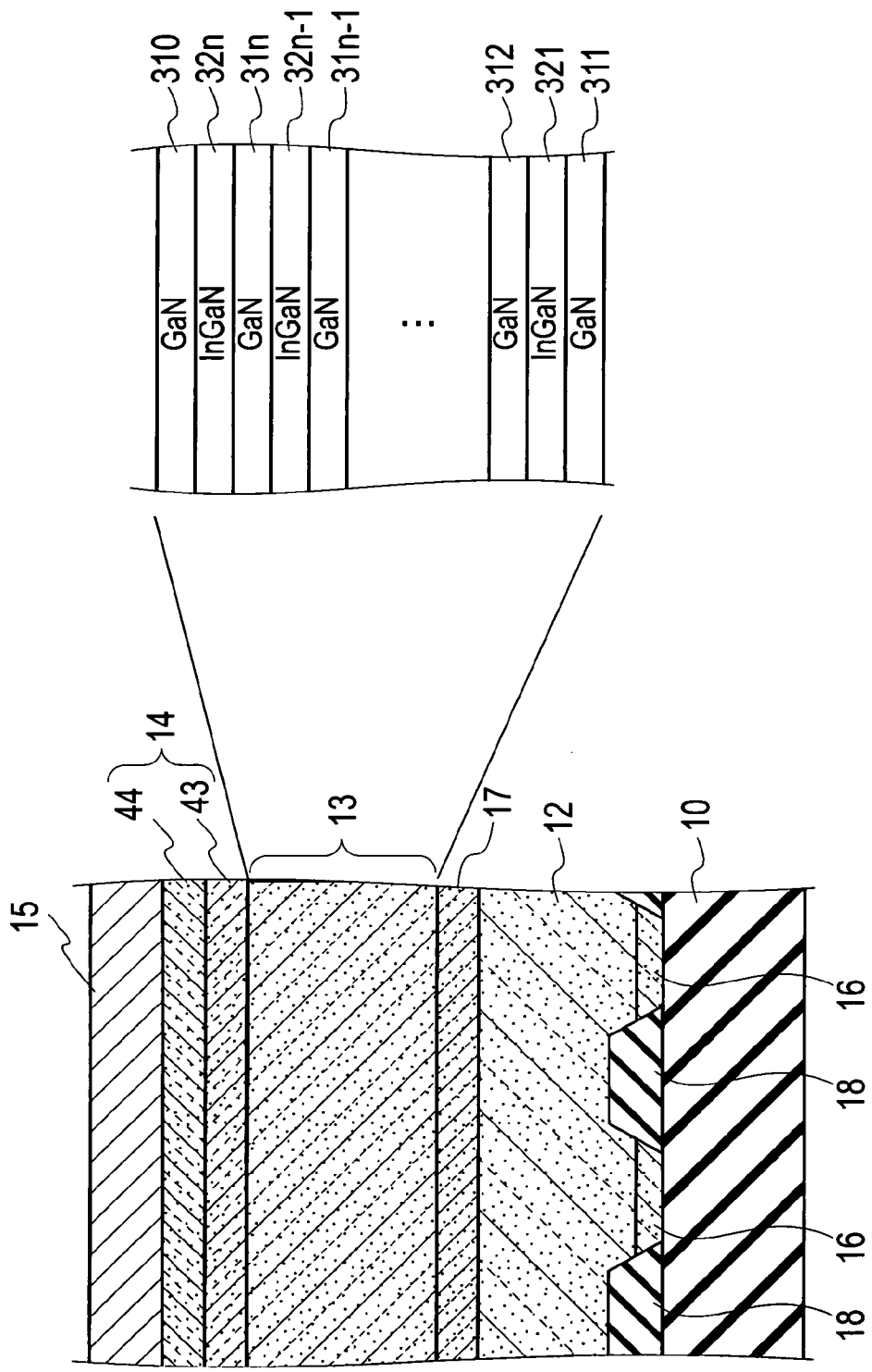
FIG. 12 is a schematic cross-sectional configuration chart of a semiconductor light emitting device according to a modified example of the first embodiment of the present invention, and is a schematic cross-sectional configuration chart to which a semiconductor light emitting device part and an active layer part are enlarged.

FIG. 12 is a schematic cross-sectional configuration chart of a semiconductor light emitting device according to a modified example of the first embodiment, and shows a schematic cross-sectional configuration chart to which the semiconductor light emitting device part and the active layer part are enlarged.

The semiconductor light emitting device according the modified example of to the first embodiment includes a substrate 10, a protective film 18, a buffer layer 16, an n-type semiconductor layer 12, a block layer 17, an active layer 13, a p-type semiconductor layer 14, and a transparent electrode 15, as shown in FIG. 11. The protective film 18 is placed on the substrate 10. The buffer layer 16 is placed on the substrate 10 pinched by the protective film 18. The n-type semiconductor layer 12 is placed on the buffer layer 16 and the protective film 18, and is doped with the n-type impurity. The block layer 17 is placed on the n-type semiconductor layer 12, and is doped with the n-type impurity by concentration lower than the n-type semiconductor layer 12. The active layer 13 is placed on the block layer 17. The p-type semiconductor layer 14 is placed on the active layer 13. The transparent electrode 15 is placed on the p-type semiconductor layer 14.

The semiconductor light emitting device according to the modified example of the first embodiment includes a third nitride based semiconductor layer 43, a fourth nitride based semiconductor layer 44, and a transparent electrode 15. The third nitride based semiconductor layer 43 doped with a p-type impurity placed on the upper part of the active layer 13. The fourth nitride based semiconductor layer 44 is placed on the third nitride based semiconductor layer, and doped with a lower concentration p-type impurity rather than the p-type impurity of the third nitride based semiconductor layer. The transparent electrode 15 is placed on the fourth nitride based semiconductor layer 44.

Moreover, the transparent electrode 15 includes either of ZnO, ITO in which Ga or Al by which impurities doping is performed to about $1\times10^{19}$ to $5\times10^{21}$ cm$^{-3}$, or ZnO containing indium.

The semiconductor light emitting device according to the modified example of the first embodiment is formed in the double layer structure which is composed of the third nitride based semiconductor layer 43 and the fourth nitride based semiconductor layer 44, on the structure of the semiconductor light emitting device according to the first embodiment. As for the third nitride based semiconductor layer 43, the p-type semiconductor layer 14 is placed directly on the upper part of the active layer 13. The fourth nitride based semiconductor layer 44 is placed on the third nitride based semiconductor layer 43, and doped with the lower concentration p-type impurity rather than the p-type impurity of the third nitride based semiconductor layer 43.

The third nitride based semiconductor layer 43 placed directly on the upper part of the active layer 13 is formed, for example by a p-type GaN layer about 40 nm thick in Mg by about $1\times10^{20}$ cm$^{-3}$ by which impurities doping is performed.

The fourth nitride based semiconductor layer 44 which is placed on the third nitride based semiconductor layer 43, and doped with the low-concentration p type impurity rather than the p-type impurity of the third nitride based semiconductor layer 43 is formed, for example by a p-type GaN layer about 10 nm thick in Mg by about $8\times10^{19}$ cm$^{-3}$ by which impurities doping is performed.

In the semiconductor light emitting device according to the modified example of the first embodiment, the p-type semiconductor layer 14 formed on the active layer 13 composed of a MQW including indium is composed of a p-type GaN layer of 2 tiered structure from which Mg concentration differs as mentioned above, and is doped with the above-mentioned concentration. The p-type GaN layer grows at low temperature about 800 degrees C. to 900 degrees C. in order to reduce the heat damage to the active layer 13.

Since the third nitride based semiconductor layer 43 nearest to the active layer 13 is a layer which determines the amount of hole injections to the active layer 13, light emitting power becomes high, so that the Mg concentration is high. For this reason, the Mg concentration is so preferable that it is high.

The fourth nitride based semiconductor layer 44 is a p-type GaN layer for reserving ohmic contact with the transparent electrode 15, and is made depletion substantially. For example, when the ZnO electrode by which impurities doping of Ga or Al is performed about $1\times10^{19}$ to $5\times10^{21}$ cm$^{-3}$ is used as the transparent electrode 15, the impurities doping of Mg is performed at the fourth nitride based semiconductor layer 44 so that it may become Mg concentration at the time when dropping most the forward voltage $V_f$ of the semiconductor light emitting device.

When growing up two layers of the p-type GaN layers, since the third nitride based semiconductor layer 43 near the p-side electrode 100, and the fourth nitride based semiconductor layer 44 need to raise the hole concentration in the film, they increase $H_2$ gas volume in the carrier gas. Or again, the third nitride based semiconductor layer 43 near the active layer 13 do not have to increase the $H_2$ gas volume in the carrier gas, and may be made to perform crystal growth by the extension into which the active layer 13 is grown up by the $N_2$ carrier gas.

Also in the semiconductor light emitting device according to the modified example of the first embodiment, since the protective film 18 placed on the substrate 10, the buffer layer 16 placed on the substrate 10 pinched by the protective film 18, the n-type semiconductor layer 12 placed on the buffer layer 16 and the protective film 18, and impurities doping of the n-type impurity is performed, the block layer 17, the active layer 13, the p-type semiconductor layer 14, the final barrier layer 310, the reflective stacked film 28, and the electrode structure are the same as that of the semiconductor light emitting device according to the first embodiment of the present invention, the description is omitted.

According to the semiconductor light emitting device according to the first embodiment and the modified example, the crystal quality and surface morphology of the III group nitride based semiconductor which are formed on high temperature AlN buffer layer 16 and the protective film 18 are improvable.

Moreover, the p-type semiconductor layer 14 is formed at low temperature and the heat damage to the active layer 13 can be reduced, and the forward voltage ($V_f$) can be reduced, thereby the luminous efficiency can be improved.

Moreover, the number of MQW pairs of the active layer 13 for the electron supplied from the n-type semiconductor layer 12 and the hole supplied from the p-type semiconductor layer 14 to recombine efficiently in the active layer 13 can be optimized, and the luminous efficiency can be improved.

Moreover, the diffusion of the p-type impurity from the p-type semiconductor layer 14 to the well layer can be controlled, the luminous efficiency can be improved, the overflow of the electron from the n-type semiconductor layer 12 to the p-type semiconductor layer 14 and the diffusion of the n-type impurity from the n-type semiconductor layer 12 to the active layer 13 can be controlled, and the luminous efficiency can be improved.

Moreover, the semiconductor light emitting device which does not need an annealing process which removes a hydrogen atom from the p-type semiconductor layer 14 can be provided, and the semiconductor light emitting device whose outward luminous efficiency improved by the reflective stacked film can also be provided.

The flip chip structure become the path which extracts the light from the GaN layer side to the external through the sapphire substrate 10 is effective at the point which may improve in particular outward luminous efficiency. From a simulation result, in the pattern of the circular, the diameter φ of which is about 5 micrometers, or lattice-shaped protective film 18, if the cone angle of 40 degrees to 60 degrees is given, optical extraction efficiency improves 1.5 times.

By creating the substrate in which the protective film 18 in which refractive indices differ partially is formed to up to the different species substrate 10, growing a nitride based semiconductor epitaxially to the direct above-mentioned substrate, and forming a light emitting device on this, not only it can form unevenness on the interface between the epitaxial growth layer and the substrate, dispersion and diffraction of light occur and optical extraction efficiency improves, but the quality of the epitaxial growth layer improves.

(Crystal Growth Plane Direction)

Figure 13A:
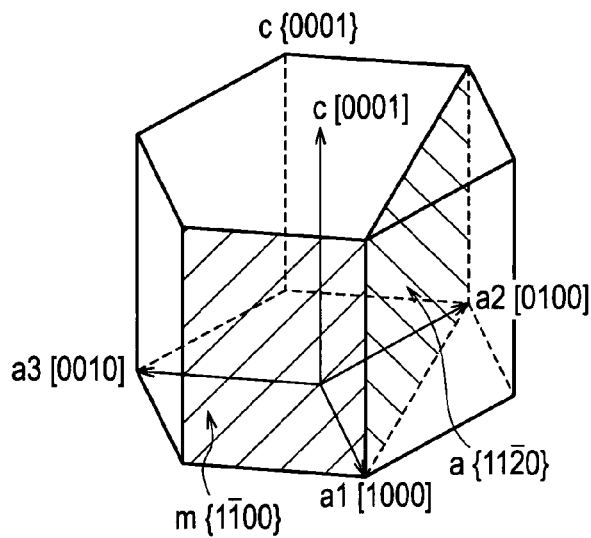
FIG. 13A is a schematic diagram for explaining a crystal plane of group III nitride semiconductor applied to the semiconductor light emitting device related to the first embodiment and its modified example of the present invention, and is a schematic diagram showing c plane, a plane, and m plane of the crystal structure of the group III nitride semiconductor.
Figure 13B:
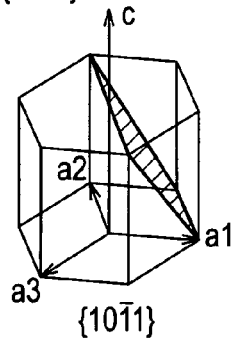
FIG. 13B is a schematic diagram for explaining the crystal plane of the group III nitride semiconductor applied to the semiconductor light emitting device according to the first embodiment and its modified example of the present invention, and is a schematic diagram for explaining a semi-polar plane {10-11}.
Figure 13C:
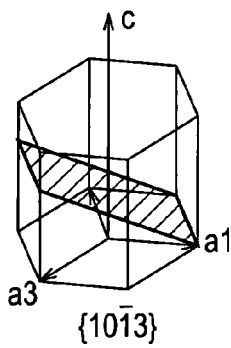
FIG. 13C is a schematic diagram for explaining the crystal plane of the group III nitride semiconductor applied to the semiconductor light emitting device according to the first embodiment and its modified example of the present invention, and is a schematic diagram for explaining a semi-polar plane {10-13}.
Figure 13D:
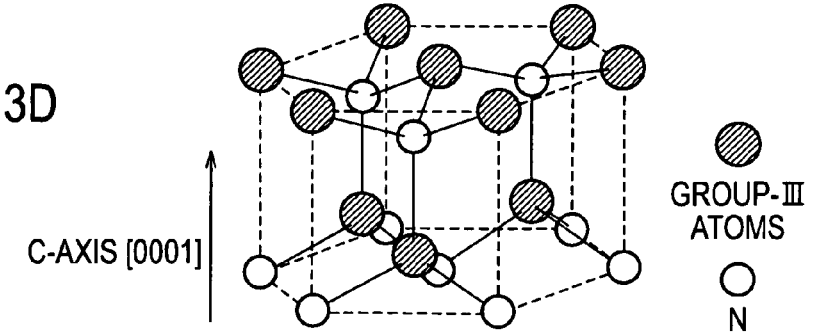
FIG. 13D is a schematic diagram for explaining the crystal plane of the group III nitride semiconductor applied to the semiconductor light emitting device according to the first embodiment and its modified example of the present invention, and is a schematic diagram showing combination of III group atoms and nitrogen atoms.

FIG. 13 is a schematic diagram for explaining the crystal plane of the group III nitride semiconductor applied to the semiconductor light emitting device according to the first embodiment and its modified example, FIG. 13A shows a schematic diagram showing c-plane, a-plane, and m-plane of the crystal structure of the group III nitride semiconductor, FIG. 13B shows a schematic diagram for explaining a semi-polar plane {10-11}, FIG. 13C shows a schematic diagram for explaining a semi-polar plane {10-13}, and FIG. 13D shows a schematic diagram showing combination of III group atoms and a nitrogen atom, respectively.

As shown in FIG. 13A to FIG. 13D, the crystal structure of the III group nitride based semiconductor can be approximated with the hexagonal system, and four nitrogen atoms is combined toward one III group atoms. Four nitrogen atoms are located at the four peaks of the regular tetrahedron which is placed III group atoms in central. As for these four nitrogen atoms, one nitrogen atom is located in +c axial direction toward III group atoms, and other three nitrogen atoms are located in the −c axis side toward III group atoms. For such a structure, the polarization direction composes a group III nitride semiconductor in line with the c axis.

The c axis is taken along the axial direction of the hexagonal prism, and the surface (crystal plane of the hexagonal prism) which makes this c axis to normal line is a c-plane {0001}. If cleavage of the crystal of the group III nitride semiconductor is performed in respect of two in parallel to c-plane, the surface (+c plane) by the side of +c axis constitutes a crystal plane where III group atoms are located in a line, and the surface (−c plane) by the side of −c axis constitutes a crystal plane where the nitrogen atom is located in a line. Therefore, since the c-plane shows character, which is different by the +c axis and −c axis side, it is called a Polar Plane.

Since +c plane and −c plane are different crystal planes, different physical properties are shown according to it. More specifically, it proves that +c plane has the high endurance toward the chemical reaction that it is strong to alkali etc., and −c plane is chemically weak conversely, for example, it melts into alkali.

On the other hand, the side of the hexagonal prism is m-plane {10-10}, respectively, and the surface passing through the ridgeline of the pair which does not adjoin each other is a-plane {11-20}. Since these are right-angled crystal planes toward c-plane and lie at right angles toward the polarization direction, they are planes without polarity, i.e., a Nonpolar Plane. Furthermore, since a crystal plane {10-11} and {10-13} sloping (it is not in parallel, either and right-angled, either) toward c-plane cross aslant toward the polarization direction as shown in FIG. 13B and FIG. 13C, it is some polar plane, i.e., Semipolar Plane. The example of other semipolar planes is a surface of {10-1-1} plane, {10-1-3} plane, {11-22} plane, etc.

For example, the GaN single crystal substrate, which applies m-plane to the principal surface, can be cut and produced from the GaN single crystal which applied c-plane to the principal surface. The m-plane of the cut substrate is ground by chemical mechanical polishing treatment, for example, and the bearing error about both the [0001] directions and the [11-20] direction shall be within ±1 degree (preferably within ±0.3 degrees). In this way, the GaN single crystal substrate, which applied m-plane to the principal surface, is obtained.

Each surface of the above-mentioned hexagonal structure can be used for the semiconductor light emitting device according to the first embodiment as the crystal principal surface, and it can form the semiconductor light emitting device by the MOCVD method etc.

In the semiconductor light emitting device according to the first embodiment and its modified example, for example, the n-type semiconductor layer 12, the active layer 13, and the p-type semiconductor layer 14 are effective to apply the nonpolar plane of hexagonal structure to the principal surface of crystal growth, and the ELO surface of the n-type semiconductor layer 12 is effective to select the pattern shape of the protective film 18 so that it may become the nonpolar plane vertical to the above-mentioned nonpolar plane.

Or again, the n-type semiconductor layer 12, the active layer 13, and the p-type semiconductor layer 14 are effective to apply m-plane of hexagonal structure to the principal surface of crystal growth, and the ELO surface of the n-type semiconductor layer 12 is effective to select the pattern shape of the protective film 18 so that it may become a-plane vertical to the above-mentioned m-plane.

Or again, the n-type semiconductor layer 12, the active layer 13, and the p-type semiconductor layer 14 are effective to apply a-plane of hexagonal structure to the principal surface of crystal growth, and the ELO surface of the n-type semiconductor layer 12 is effective to select the pattern shape of the protective film 18 so that it may become m-plane vertical to the above-mentioned a-plane.

Or again, the n-type semiconductor layer 12, the-active layer 13, and the p-type semiconductor layer 14 are effective to apply the semipolar plane of hexagonal structure to the principal surface of crystal growth, and the ELO surface of the n-type semiconductor layer 12 is effective to select the pattern shape of the protective film 18 so that it may become a-plane vertical to the above-mentioned semipolar plane or m-plane.

Or again, the n-type semiconductor layer 12, the active layer 13, and the p-type semiconductor layer 14 are effective to apply the polar plane of hexagonal structure to the principal surface of crystal growth, and the ELO surface of the n-type semiconductor layer 12 is effective to select the pattern shape of the protective film 18 so that it may become m-plane or a-plane.

(Electrode Structure)

Figure 14:
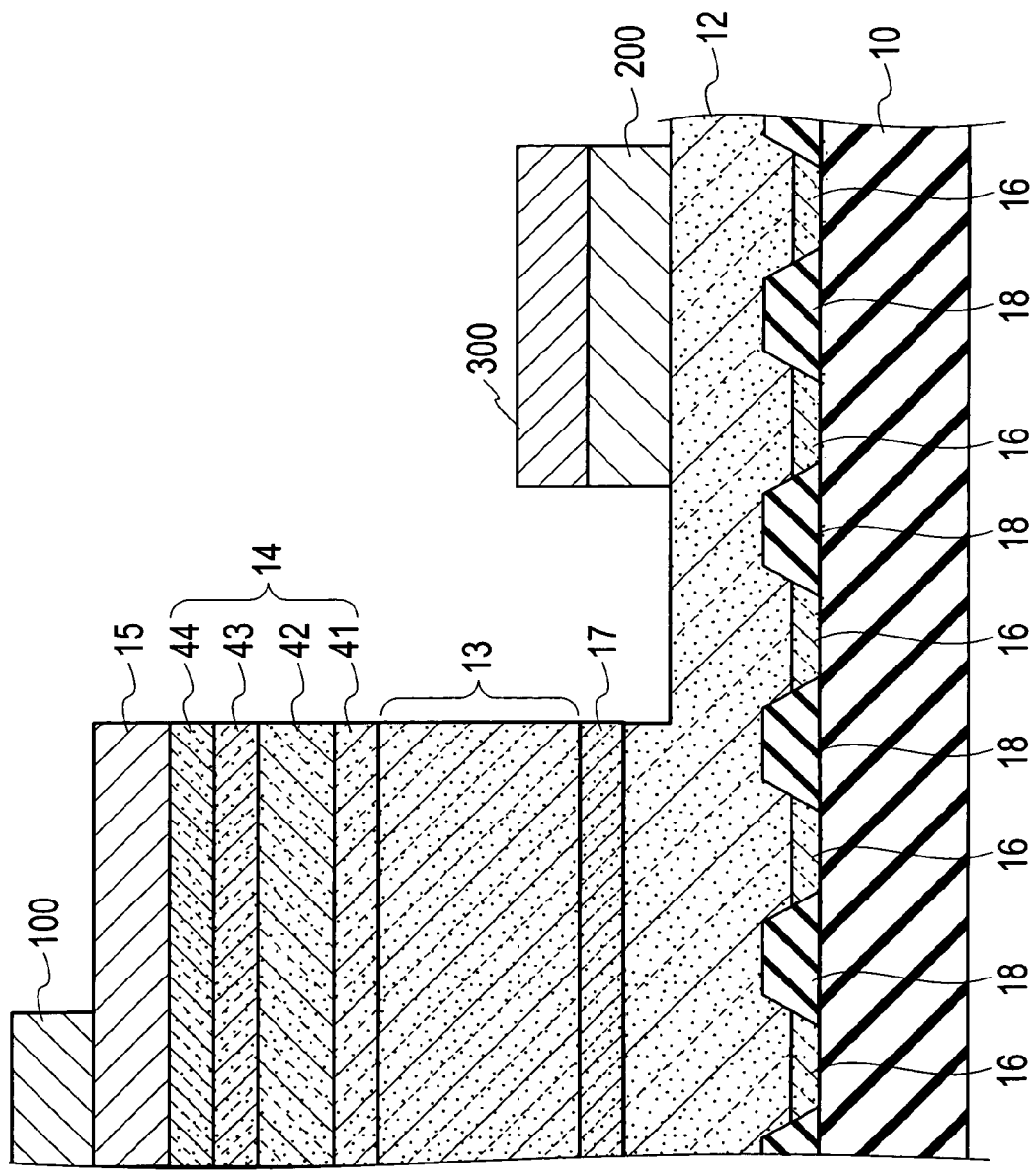
FIG. 14 is a schematic cross-sectional configuration chart formed to the p-side electrode and the n-side electrode in the semiconductor light emitting device according to the first embodiment of the present invention shown in FIG. 11.

The semiconductor light emitting device according to the first embodiment is further includes n-side electrodes 200 and 300 for applying voltage to the n-type semiconductor layer 12, and a p-side electrode 100 for applying voltage to the p-type semiconductor layer 14, as shown in FIG. 14. As shown in FIG. 14, the n-side electrode 200 is placed on the surface of the p-type semiconductor layer 14, the active layer 13, the block layer 17, and the n type semiconductor layer 12 that performed mesa etching and exposed of the partial region of the n-type semiconductor layer 12.

The p-side electrode 100 is placed on the p-type semiconductor layer 14 through the transparent electrode 15. Or again, the p-side electrode 100 may be directly placed on the p-type semiconductor layer 14. The transparent electrode 15 placed on the fourth nitride based semiconductor layer 44 includes either of the ZnO, ITO, or ZnO containing indium, for example.

The n-side electrodes 200 and 300 are composed of an aluminum (Al) film, a multilayer film of Ti/Ni/Au or Al/Ti/Au, Al/Ni/Au, Al/Ti/Ni/Au, or a multilayer film of Au—Sn/ Ti/Au/Nil/Al from the upper layer, for example, and the p-side electrode 100 is composed of an Al film, a palladium (Pd)-gold (Au) alloy film, a multilayer film of Ni/Ti/Au, or a multilayer film of Au—Sn/Ti/Au from the upper layer, for example. And, ohmic contact of the n-side electrodes 200 and 300 is performed to the n-type semiconductor layer 12, and ohmic contact of the p-side electrode 100 is performed to the p-type semiconductor layer 14 through the transparent electrode 15, respectively.

Figure 15:
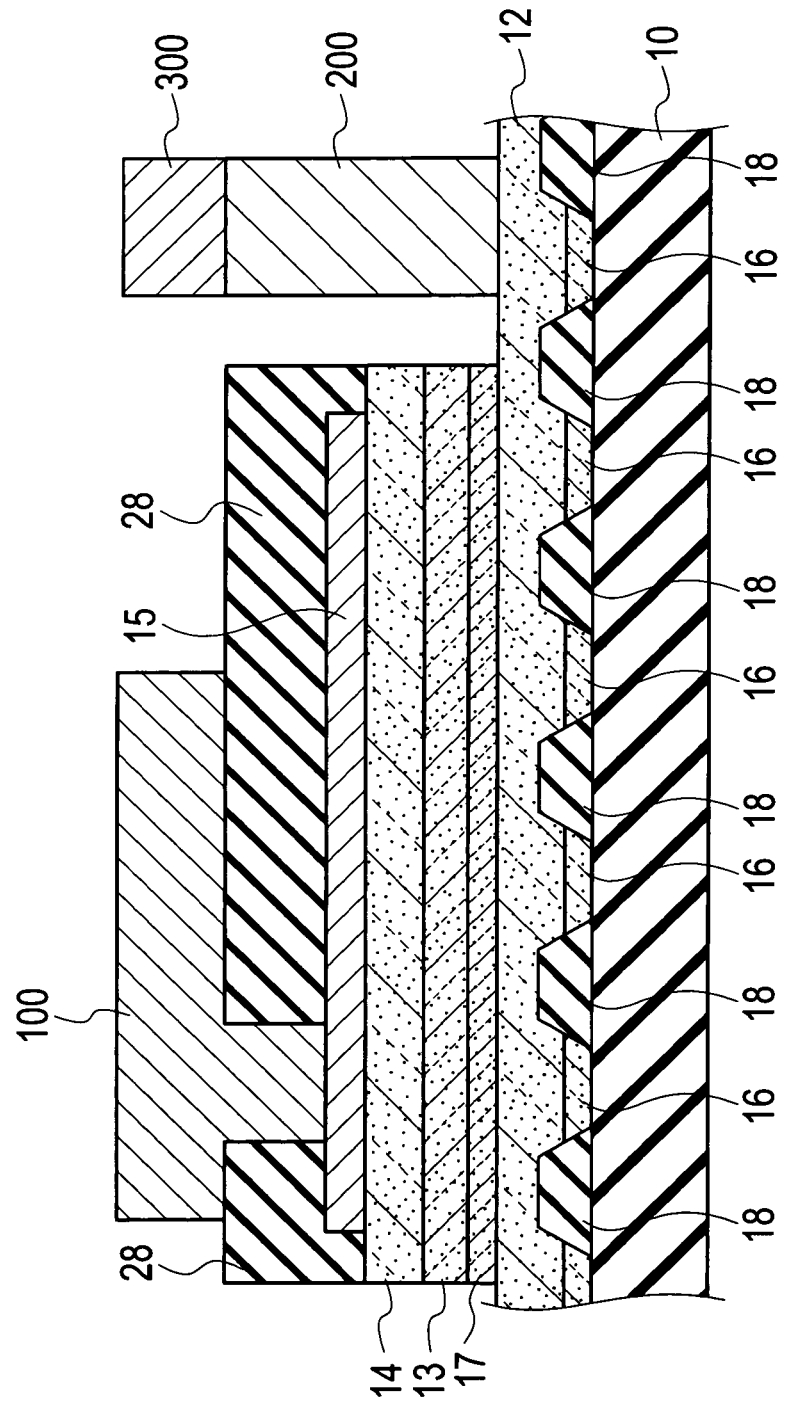
FIG. 15 is a schematic cross-sectional configuration chart of the semiconductor light emitting device in which flip chip structure is formed according to the first embodiment of the present invention.

In FIG. 15, in order that the semiconductor light emitting device according to the first embodiment is mounted on flip chip structure, the surface of the p-side electrode 100 and the surface of the n-side electrode 300 are formed so that the height measured from the substrate 10 may constitute the substantially same height.

The structure of FIG. 15 forms the transparent conducting film ZnO as the transparent electrode 15, and is provided with a structure, which wraps this ZnO by the reflective stacked film 28. The reflective stacked film 28 reflects toward the wavelength λ of the light, which emits.

The reflective stacked film 28 has the layered structure of $\lambda/4n_1$ and $\lambda/4n_2$ (where $n_1$ and $n_2$ are refractive indices of a layer to laminate). As a material used for layered structure, the layered structure composed of $ZrO_2$ (n=2.12) and $SiO_2$ (n=1.46) can be used, for example toward λ=450 nm blue light. The thickness of each layer in this case sets $ZrO_2$ to about 53 nm, and sets $SiO_2$ to about 77 nm, for example. $TiO_2$, $Al_2O_3$, etc. can also be used as other materials for forming the layered structure.

According to the semiconductor light emitting device according to the first embodiment, since the light which emitted light within the active layer 13 by the reflective stacked film 28 can be extracted from the substrate 10 side external, without being absorbed by the p-side electrode 100, outward luminous efficiency can be improved.

As above-mentioned, the flip chip structure forms the path, which extracts light from the GaN layer side to the external through the sapphire substrate 10, is effective at the point which may improve in particular outward luminous efficiency. By creating the substrate in which the protective film 18 in which refractive indices differ partially is formed to up to the different species substrate 10, growing the nitride based semiconductor epitaxially to the direct above-mentioned substrate on this, and forming the light emitting device, unevenness can be formed on the interface between the epitaxial growth layer and the substrate, dispersion and diffraction of light occur, and optical extraction efficiency improves.

(Fabrication Method)

As shown in FIG. 2 to FIG. 8, a fabrication method of the semiconductor light emitting device according to the first embodiment includes: a process for preparing the substrate 10; a process for forming the protective film 18 on the substrate 10; a process for patterning the protective film 18 and exposing the substrate 10; a process for forming the n-type semiconductor layer 12 doped with the n-type impurity with ELO on the substrate 10 and the protective film 18 pinched to the protective film 18 and exposed; the process for forming the active layer 13 on the n-type semiconductor layer 12; and a process for forming the p-type semiconductor layer 14 doped with the p-type impurity on the active layer 13.

Moreover, the fabrication method of the semiconductor light emitting device according to the first embodiment further includes a process for forming the buffer layer 16 on the substrate 10 pinched to the protective film 18 and exposed, after the process for exposing the substrate 10.

Moreover, the process of forming the n-type semiconductor layer 12 with ELO includes a process for forming by the first pressure at the time of ELO, and a process for forming by the second pressure higher than the first pressure.

Hereinafter, with reference to FIG. 2 to FIG. 8, the fabrication method of the semiconductor light emitting device according to the first embodiment will be explained. The fabrication method of the semiconductor light emitting device described in the following is an example, and, of course, it can achieve with various fabrication methods except this method, including this modified example. Here, an example which applies the sapphire substrate to the substrate 10 will be explained.

Figure 2:
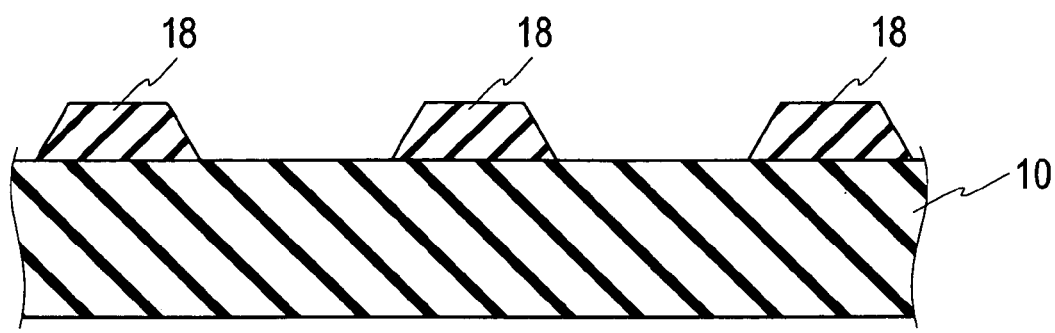
FIG. 2 is a schematic cross-sectional configuration chart for explaining one process of a fabrication method of the semiconductor light emitting device according to the first embodiment of the present invention.

(a) First of all, as shown in FIG. 2, prepare the sapphire substrate 10, form the protective film 18 on the sapphire substrate 10 and then perform patterning, and expose the surface of the substrate 10.

The protective film 18 is transparent toward a luminous wavelength, and the refractive index of the protective film 18 forms a silicon dioxide film, a silicon nitride film, a silicon oxynitride film, a titanium oxide film, an alumina film etc. which are a material almost equal to the refractive index of the substrate 10 by CVD (Chemical Vapor Deposition), or PVD (Physical Vapor Deposition), such as sputtering.

As the pattern size of the protective film 18, about 10 micrometers of the width maximum is preferable, and not less than about 100 nm, about 1 micrometer, of the thickness is preferable, for example. The shape of the protective film 18 has effective one of the pattern shape which does not obstruct an epitaxially lateral over growth (ELOG), such as a triangle, a rhombus, a hexagon, circular, and a stripe. In particular, in order to perform ELOG, the direction of the pattern is selected in consideration of a-plane and m-plane which are lateral over growth surfaces. When extracting light from the back side of the substrate 10, or the upper surface of the epitaxial growth layer, since unevenness occurs on the interface of the protective film 18 and the epitaxial growth layer, the light is scattered or diffracted, and the light total reflection is performed by the interface between the refractive index difference of the epitaxial growth layer and the different species substrate is extracted efficiently outside.

Figure 3:
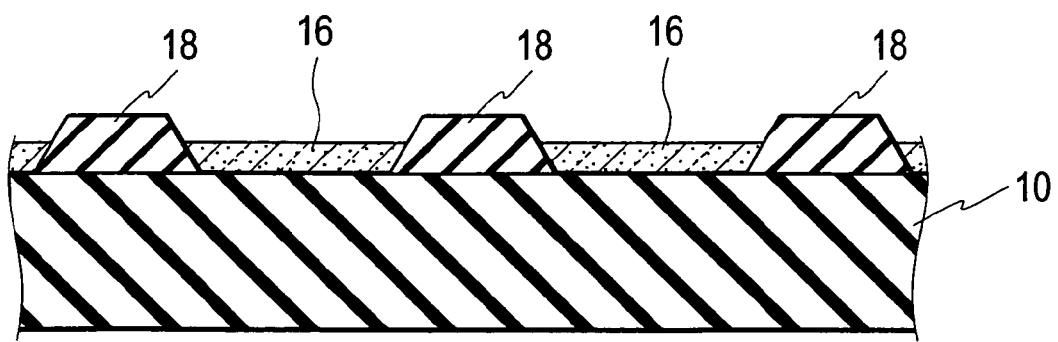
FIG. 3 is a schematic cross-sectional configuration chart for explaining one process of the fabrication method of the semiconductor light emitting device according to the first embodiment of the present invention.

(b) Next, as shown in FIG. 3, grow up the AlN buffer layer 16 on the sapphire substrate 10 exposed by the MOCVD (Metal Organic Chemical Vapor Deposition) method etc., which are well known. For example, by supplying trimethyl aluminum (TMA) and ammonia ($NH_3$) to a reaction chamber by applying H2 gas as a carrier in high temperature (about 900 degrees C.-degree 950 degrees C.), thin AlN buffer layer 16 about 10 to 50 angstrom thick is grown up for a short time.

Figure 4:
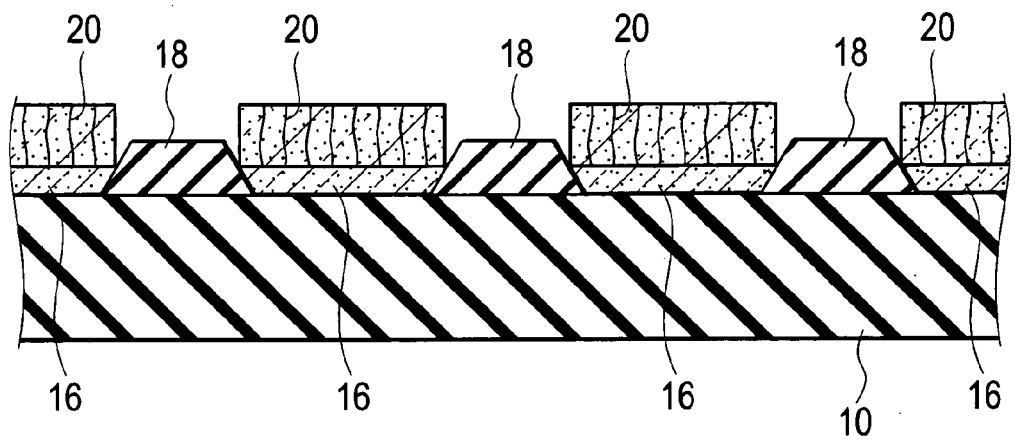
FIG. 4 is a schematic cross-sectional configuration chart for explaining one process of the fabrication method of the semiconductor light emitting device according to the first embodiment of the present invention.

(c) Next, as shown in FIG. 4, grow up the GaN layer, which becomes the n-type semiconductor layer 12 by the MOCVD method etc. on AlN buffer layer 16. For example, after performing thermal cleaning of the substrate 10 in which AlN buffer layer 16 is formed, the substrate temperature is set as about 1000 degree C., and about 1 to 5 micrometers of n-type semiconductor layers 12 which performs impurities doping of the n-type impurity on the AlN buffer layer 16 are grown up. The GaN film, which performs impurities doping of the Si by about $3 \times 10^{18}$ $cm^{-3}$ concentration, for example as the n-type impurity is adoptable as the n-type semiconductor layer 12. When performing impurities doping of the Si, trimethylgallium (TMG), ammonia ($NH_3$), and silane ($SiH_4$) are supplied as material gas, and the n-type semiconductor layer 12 is formed. As shown in FIG. 4, the penetration dislocation 20 is occurred in the GaN layer which becomes the n-type semiconductor layer 12.

Figure 5:
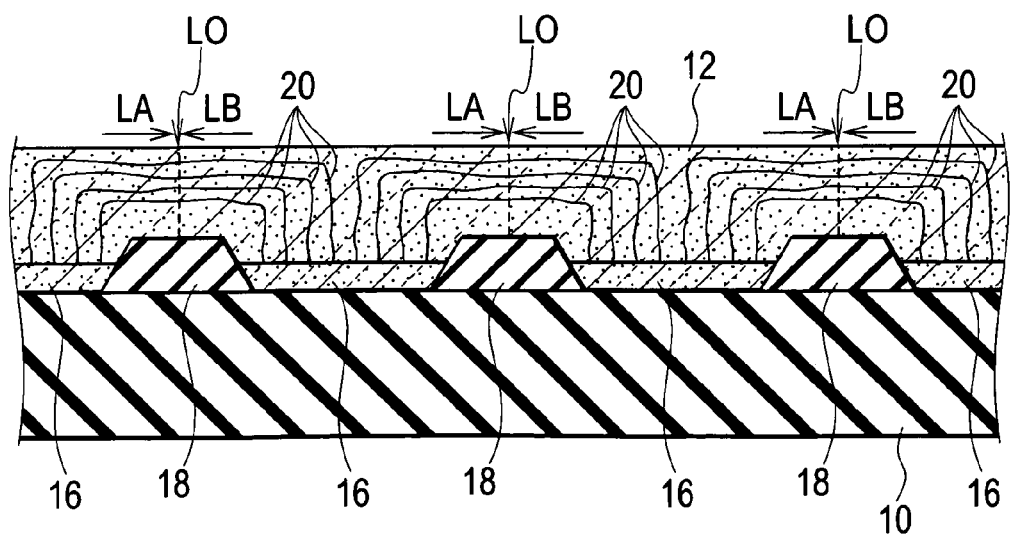
FIG. 5 is a schematic cross-sectional configuration chart for explaining one process of the fabrication method of the semiconductor light emitting device according to the first embodiment of the present invention.

(d) Next, as shown in FIG. 5, form the n-type semiconductor layer 12 by ELO. An epitaxially lateral over growth layer is formed on the m-plane or a-plane which is an epitaxially lateral over growth plane, and selective epitaxial growth of the n-type semiconductor layer 12 is performed in vector LA and LB direction in FIG. 5, in a horizontal direction. As a result, the penetration dislocation 20 is also bent, the selective epitaxial growth plane from right and left combines near central part LO of the protective film 18, and the penetration dislocation 20 is also linked simultaneously.

In order to bury the protective film 18, the epitaxial growth condition may be changed into the conditions which accelerate the ELO from a halfway.

In order to accelerate ELO, it is effective to, change the pressure of the gas series at the time of crystal growth for example. About 1.5 micrometers can be grown up, for example, at about 200 Torrs in about 1050 degrees C. as the second step, after growth about 1 micrometer, for example, at about 100 Torrs in about 1050 degrees C. as the first step. Thus, by forming the n-type semiconductor layer 12, the ELO can be accelerated with the reduction effect of the penetration dislocation density by ELO.

In order to perform the ELO so that the protective film 18 may be covered, the penetration dislocation of the crystal can be bent and crystal quality also improves.

Furthermore, the pressure and the growth temperature conditions which form the n-type semiconductor layer 12 are changed, dividing into the step of several times is also possible, for example, as shown in FIG. 6, the n-type semiconductor layer 12 (121, 122, 123, 124) of 4 tiered structure can also be formed. By doing in this way, the surface morphology of the n-type semiconductor layer 12 is improved, and crystal quality can be improved.

For example, when forming the pattern of the protective film 18 in stripe shape, the stripe is applied into <11-20> or the <1-100> direction, sets the width of the protective film 18 to about 1 to 4 micrometers, and sets a repeated period to about 7 micrometers. On this, GaN which acts as the n-type semiconductor layer 12 at 1000 degrees C. is grown up by the HVPE method. In the HVPE method, $NH_3$ is made to react to GaCl, and GaN is grown up. When the stripe direction is <11-20>, first of all in the opening of the protective film 18, as for the growth of GaN, the shape of the triangle cross section which applies a facet the {1-101} plane sloping toward the substrates face occurs by the growth of a direction at first (0001). Next, with the facet held, on the protective film 18, lateral growth progresses until the adjoining growing region combines. After combination, the growth progresses so that the surface may further planarize, and the completely flat growth layer which has a surface (0001) is obtained. Although {11-22} plane acts as the facet in the pattern of the <1-100> direction in the stripe, the same growth layer is obtained.

The above-mentioned example is an example, and it can also apply other patterns and directions of the pattern. Moreover, although the principal surface of crystal growth explained the example of the polar plane in the above-mentioned example, it can also apply the nonpolar plane and the semipolar plane.

(e) Next, the GaN film which performed impurities doping of the Si as the block layer 17 on the n-type semiconductor layer 12 by less than $1 \times 10^{17}$ $cm^{-3}$ (for example, about $8 \times 10^{16}$ $cm^{-3}$) concentration, for example, grow up about 200 nm. At this time, the same material gas as the case where the n-type semiconductor layer 12 is formed is applicable.

Figure 7:
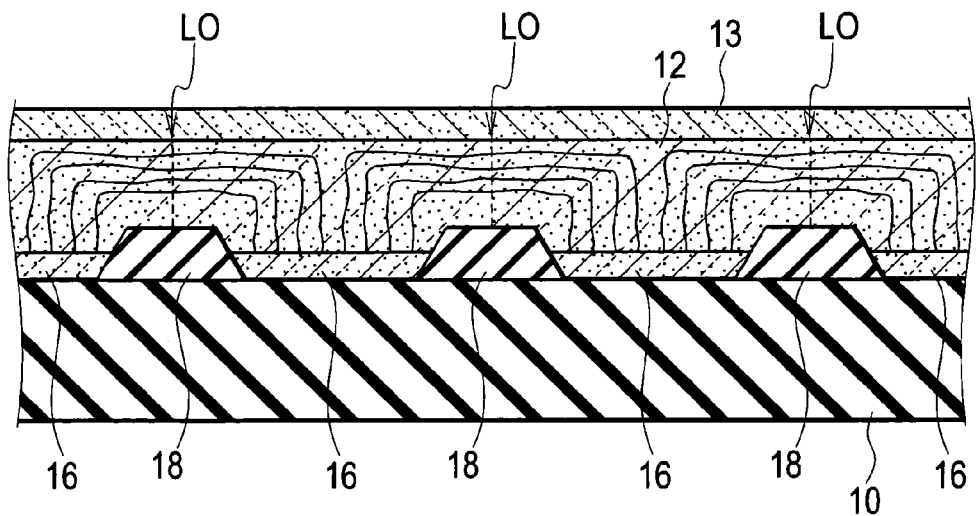
FIG. 7 is a schematic cross-sectional configuration chart for explaining one process of the fabrication method of the semiconductor light emitting device according to the first embodiment of the present invention.

(f) Next, as shown in FIG. 7, form the active layer 13 on the n-type semiconductor layer 12. For example, the well layer 32 composed of the barrier layer 31 and the InGaN film which are composed of the GaN film is laminated by turns, and the active layer 13 is formed. More specifically, adjusting the substrate temperature and the flow rate of material gas at the time of forming the active layer 13, the barrier layer 31 and the well layer 32 are grown up continuously by turns, and the active layer 13 which the barrier layer 31 and the well layer 32 laminate is formed. That is, the process of laminating the well layer 32 and the barrier layer 31 with a larger band gap than the well layer 32 is applied a unit process by adjusting substrate temperature and the flow rate of material gas, and this unit process is repeated n times (for example, about 8 times), and the layered structure which the barrier layer 31 and the well layer 32 laminate by turns is obtained.

When forming the barrier layer 31, TMG gas and $NH_3$ gas are supplied to a processing unit for film formation as material gas, respectively, for example. On the other hand, when forming the well layer 32, TMG gas, trimethylindium (TMI) gas, and $NH_3$ gas are supplied to the processing unit as material gas, respectively, for example. In addition, the TMG gas is supplied as material gas of a Ga atom, the TMI gas is supplied as material gas of an In atom, and the $NH_3$ gas is supplied as material gas of a nitrogen atom.

On the formed layered structure, about 10 nm of the GaN films non-doped as the final barrier layer 310 are formed, and the active layer 13 shown in FIG. 1 or FIG. 11 is formed. As already explained above, the film thickness $d_0$ of the final barrier layer 310 is set as the thickness to which the p-type dopant diffused in the active layer 13 from the p-type semiconductor layer 14 does not reach the well layer 32 of the active layer 13.

Figure 8:
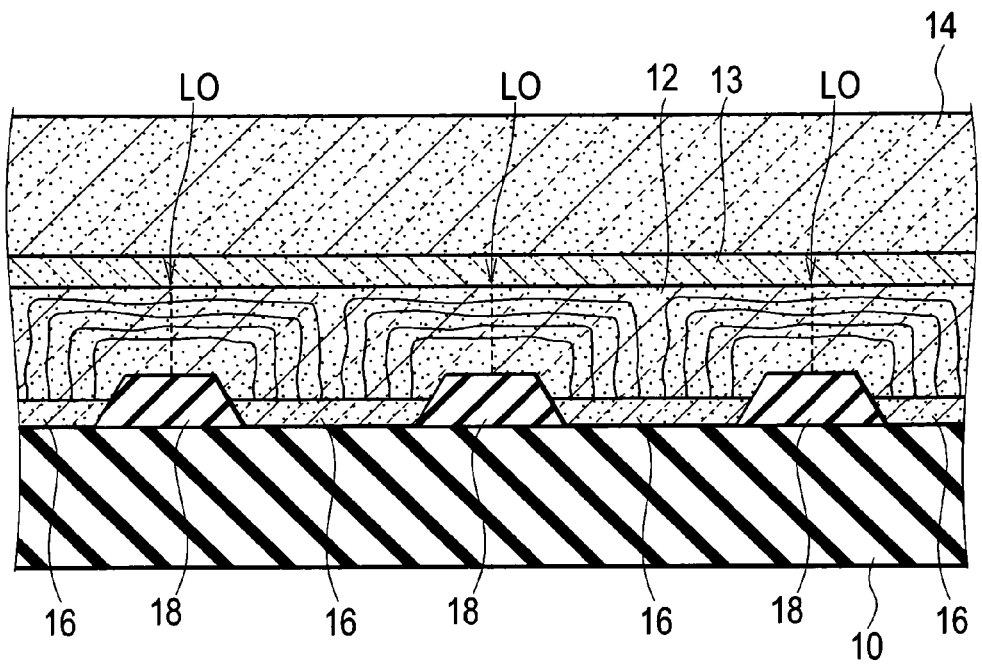
FIG. 8 is a schematic cross-sectional configuration chart for explaining one process of the fabrication method of the semiconductor light emitting device according to the first embodiment of the present invention.

(g) Next, as shown in FIG. 8, the substrate temperature is set to 800 degrees C. to degree 900 degrees C., and form about 0.05 to 1 micrometer of p-type semiconductor layers 14 which perform impurities doping of the p-type impurity on the final barrier layer 310.

The p-type semiconductor layer 14 is formed in 4 tiered structures which perform impurities doping of Mg, for example as the p-type impurity. The first nitride based semiconductor layer 41 placed on the upper part of the active layer 13 is formed by the p-type GaN layer about 50 nm thick by about $2 \times 10^{20}$ $cm^{-3}$, the second nitride based semiconductor layer 42 is formed by the p-type GaN layer about 100 nm thick by about $4 \times 10^{19}$ $cm^{-3}$, the third nitride based semiconductor layer 43 is, for example formed by the p-type GaN layer about 40 nm thick by about $1 \times 10^{20}$ $cm^{-3}$, and the fourth nitride based semiconductor layer 44 is formed by the p-type GaN layer about 10 nm thick by about $8 \times 10^{19}$ $cm^{-3}$.

When performing impurities doping of Mg, TMG gas, $NH_3$ gas, and bis(cyclopentadienyl) magnesium ($Cp_2Mg$) gas are supplied as material gas, and the p-type semiconductor layer 14 (41-44) is formed. Mg is prevented from being spread in the well layer 32 of the active layer 13 by the final barrier layer 310 although Mg is spread in the active layer 13 from the p-type semiconductor layer 14 (41-44) at the time of formation of the p-type semiconductor layer 14 (41-44).

(h) Next, form the transparent electrode 15 on the upper part of the p-type semiconductor layer 14 by vacuum evaporation, sputtering technology, etc. As the transparent electrode 15, either of the ZnO, ITO, or ZnO containing indium can be used, for example. Furthermore, it may perform impurities doping of the n-type impurities, such as Ga or Al, at high concentration to about $1 \times 10^{19}$ to $5 \times 10^{21}$ $cm^{-3}$.

(i) Next, as shown in FIG. 9, form the reflective stacked film 28 reflected toward the wavelength λ of the light, which emits so that the transparent electrode 15 may be covered by vacuum evaporation, sputtering technology, etc. after patterning the transparent electrode 15.

(j) Next, perform and remove mesa etching even of the halfway of the reflective stacked film 28 and the p-type semiconductor layer 14 to the n-type semiconductor layer 12 by using etching technology, such as RIE (Reactive Ion Etching), and expose the surface of the n-type semiconductor layer 12.

(k) Next, form the n-side electrodes 200 and 300 on the surface of the exposed n-type semiconductor layer 12 by vacuum evaporation, sputtering technology, etc. Also toward the transparent electrode 15 on the p-type semiconductor layer 14, the p-side electrode 100 is formed by vacuum evaporation, sputtering technology, etc. after the pattern formation, and the semiconductor light emitting device shown in FIG. 9, FIG. 14, or FIG. 15 is completed.

According to the first embodiment, the semiconductor light emitting device and the fabrication method for the semiconductor light emitting device whose outward luminous efficiency improved can be provided.

Second Embodiment (Element Structure)

Figure 16:
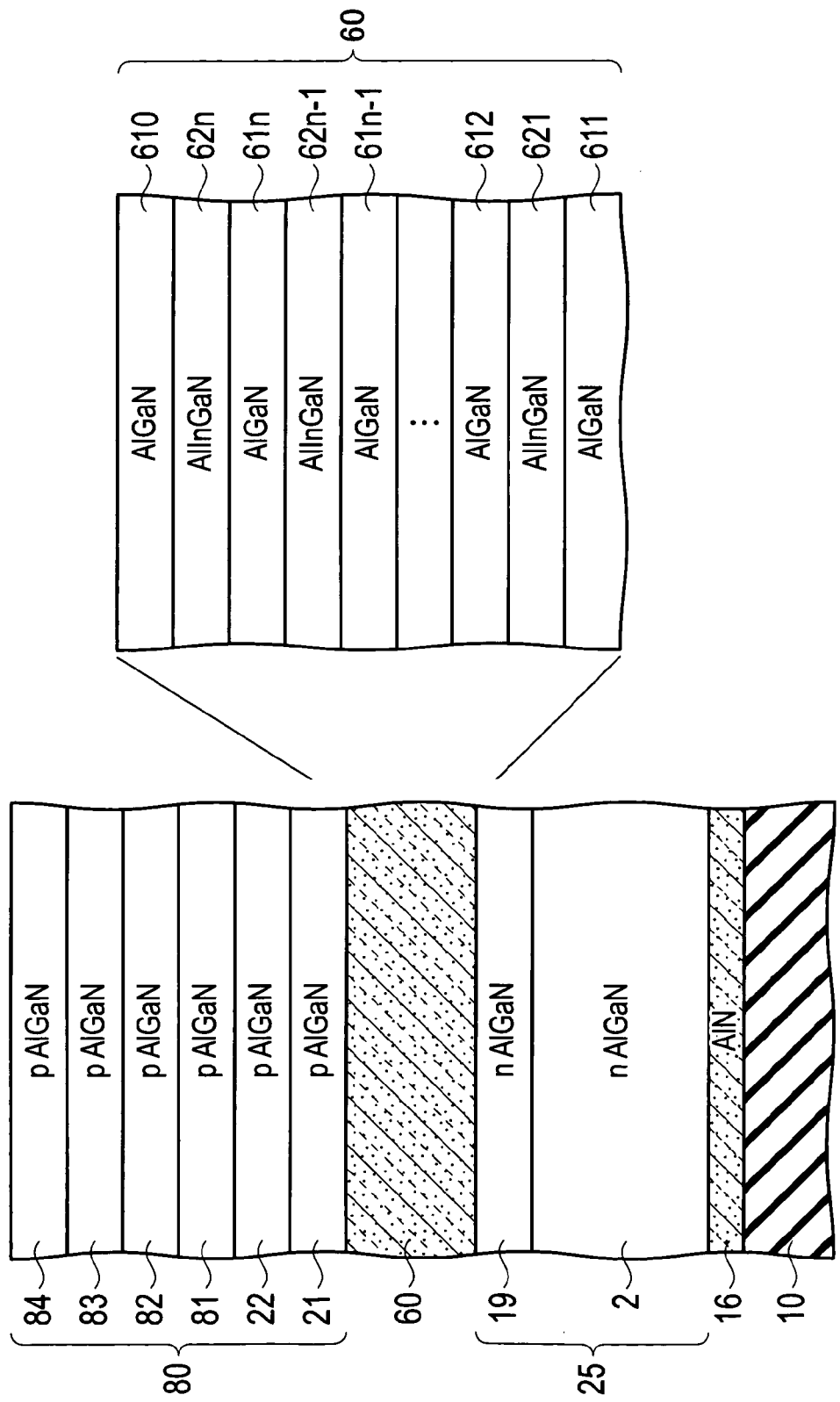
FIG. 16 is a schematic cross-sectional configuration chart of a semiconductor light emitting device according to a second embodiment of the present invention, and is the schematic cross-sectional configuration chart to which a semiconductor light emitting device part and an active layer part are enlarged.

A semiconductor light emitting device according to a second embodiment of the present invention includes a substrate 10, an AlN buffer layer 16, an n-type semiconductor layer 25, an active layer 60, and a p-type semiconductor layer 80, as shown in FIG. 16. The AlN buffer layer 16 is placed on the substrate 10. The n-type semiconductor layer 25 is placed on the AlN buffer layer 16, and is composed of an $Al_xGa_{1-x}N$ layer (where 0<x<1) by which impurities doping of an n-type impurity is performed. The active layer 60 is placed on the n type semiconductor layer 25, and is composed of a MQW having a layered structure by which the well layer composed of a barrier layer composed of an $Al_xGa_{1-x}N$ layer (where 0<x<1) and an $Al_xIn_yGa_{1-x-y}N$ layer (where 0<x<=y<1, 0<x+y<1) in which a band gap is smaller than the barrier layer is placed by turns. The p-type semiconductor layer 80 is placed on the active layer 60, and is composed of an $Al_xGa_{1-x}N$ layer (where 0<=x<1) by which impurities doping of a p-type impurity is performed.

The active layer 60 has a layered structure by which well layers 621 to 62n is placed by turns, as shown in FIG. 16. The well layers 621 to 62n are composed of barrier layers 611 to 61n and 610 composed of an $Al_xGa_{1-x}N$ layer (where 0<x<1) and an $Al_xIn_yGa_{1-x-y}N$ layer (where 0<x<=y<1, 0<x+y<1) in which a band gap is smaller than the barrier layers 611 to 61n and 610. The $1^{st}$ barrier layer 611 to the $n^{th}$ barrier layer 61n included in the active layer 60 are hereinafter named generically, and are called "barrier layer 61". Moreover, all the well layers included in the active layer 60 are named generically, and are called "well layer 62".

The film thickness of the final barrier layer 610 of the top layer of the above-mentioned layered structure may be formed more thickly than the thickness of other barrier layers (the $1^{st}$ barrier layer 611 to the $n^{th}$ barrier layer 61n) included in the layered structure except the final barrier layer 610.

In the semiconductor light emitting device shown in FIG. 16, the concentration of a p-type dopant of the final barrier layer 610 gradually decreases along to the thickness direction of the final barrier layer 610 from the first principal surface of the final barrier layer 610 which contacts the p-type semiconductor layer 80, and a p-type dopant does not exist in the second principal surface that opposes the first principal surface.

The sapphire substrate of c-plane (0001) and 0.25 degree off, etc. are adoptable as the substrate 10, for example. The n-type semiconductor layer 25, the active layer 60, and the p-type semiconductor layer 80 are composed of an AlGaN layer, respectively, and the buffer layer 16, the n-type nitride based semiconductor layer 2, the n-type contact layer 19, the active layer 60, and the p-type semiconductor layer 80 are laminated one after another on the substrate 10.
(AlN Buffer Layer)

The buffer layer 16 is formed by an AlN layer about 10 angstrom to 50 angstrom thick, for example. When performing crystal growth of the AlN buffer layer 16, for example, it is made to grow up in the high temperature of a temperature span (about 900 degrees C. to 950 degrees C.).

By supplying trimethyl aluminum (TMA) and ammonia ($NH_3$) to a reaction chamber by applying H2 gas as a carrier, it can form being able to grow up thin AlN buffer layer 16 about 10 to 50 angstrom thick at high speed, and crystal quality also is keeping satisfactory.
(N-Type Semiconductor Layer)

The n-type semiconductor layer 25 includes the n-type nitride based semiconductor layer 2 and the n-type contact layer 19, as shown in FIG. 16. The n-type nitride based semiconductor layer 2 is placed on the AlN buffer layer 16, and is composed of an $Al_xGa_{1-x}N$ layer (where 0<x<1) by which impurities doping of the n-type impurity is performed. The n-type contact layer 19 is placed on the n-type nitride based semiconductor layer 2, and is composed of an $Al_xGa_{1-x}N$ layer (where 0<x<1) by which impurities doping of the n-type impurity is performed.

The impurities doping of the n-type impurities, such as silicon (Si), is performed at the n-type nitride based semiconductor layer 2, and the film thickness is about 1 to 6 micrometers, for example.

The n-type nitride based semiconductor layer 2 supplies an electron to the active layer 60, and the p-type semiconductor layer 80 supplies a hole to the active layer 60. When the electron and the hole which are supplied recombine by the active layer 60, the light is generated.

According to the semiconductor light emitting device according to the second embodiment, since the $Al_xGa_{1-x}N$ layer (where 0<x<1) which has a lattice constant comparatively near the AlN layer is formed on high temperature AlN buffer layer 16, the crystal quality of the n-type semiconductor layer 25 and surface morphology can be improved, and the transparency over the luminous wavelength can be improved.
(Active Layer)

The active layer 60 is the MQW structure of having the $1^{st}$ well layer 621 to the $n^{th}$ well layer 62n, as shown in FIG. 16 (where n is natural number). The $1^{st}$ well layer 621 to the $n^{th}$ well layer 62n are composed of an $Al_xIn_yGa_{1-x-y}N$ layer (where 0<x<=y<1, 0<x+y<1) inserted, respectively by the $1^{st}$ barrier layer 611 to the $n^{th}$ barrier layer 61n and the final barrier layer 610 composed of an $Al_xGa_{1-x}N$ layer (where 0<x<1). That is, the active layer 60 applies quantum well structure to unit pair structure, and has n pair structure which laminated this unit pair structure n times. The quantum well structure is inserted in the shape of sandwiches by the barrier layer 61 composed of an $Al_xGa_{1-x}N$ layer with a greater band gap (where 0<x<1) than the well layer 62 with the well layer 62 composed of an $Al_xIn_yGa_{1-x-y}N$ layer (where 0<x<=y<1, 0<x+y<1).

More specifically, the $1^{st}$ well layer 621 is placed between the $1^{st}$ barrier layer 611 and the $2^{nd}$ barrier layer 612, and the $2^{nd}$ well layer 622 is placed between the $2^{nd}$ barrier layer 612 and the $3^{rd}$ barrier layer 613. And the $n^{th}$ well layer 62n is placed between the $n^{th}$ barrier layer 61n and the final barrier layer 610. The $1^{st}$ barrier layer 611 of the active layer 60 is placed through the n-type contact layer 19 on the n-type nitride based semiconductor layer 2, and the p-type semiconductor layer 80 (21, 22, and 41 to 44) is placed on the final barrier layer 610 of the active layer 60.

Moreover, the impurities doping of the n-type impurity may be performed through all at the $1^{st}$ well layer 621 to the $n^{th}$ well layer 62n. The $1^{st}$ well layer 621 to the $n^{th}$ well layer 62n are composed of the $1^{st}$ barrier layer 611 to the $n^{th}$ barrier layer 61n composed of an $Al_xGa_{1-x}N$ layer (where 0<x<1), and an $Al_xIn_yGa_{1-x-y}N$ layer (where 0<x<=y<1, 0<x+y<1) inserted respectively by the $1^{st}$ barrier layer 611 to the $n^{th}$ barrier layer 61n, and the final barrier layer 610. For example, the impurities doping of the Si atom may be performed about $5\times10^{16}$ as an n-type impurity, for example.

The number of pairs of the MQW layer is characterized by being 2 to 8, for example. In addition, the ratio {y/(1-x-y)} of indium (In) of the well layers 621 to 62n is suitably set up according to the wavelength of light to be generated.

For example, the composition ratio y of In is about 0.15, and the composition ratio of Al is about 0.01 to about 0.1, for example.

The thickness of the well layer 621 to 62n is about 2 to 3 nm (preferable about 2.8 nm), for example, and the thickness of the barrier layers 611 to 61n is about 7 to 18 nm (preferable about 16.5 nm).

In the semiconductor light emitting device according to the second embodiment, the number of MQW pairs in the active layer 60 for the electron supplied from the n-type semiconductor layer 25 and the hole supplied from the p-type semiconductor layer 80 to recombine efficiently in the active layer 60 can be optimized.

In the semiconductor light emitting device according to the second embodiment, since it has the well layer 62 composed of the $Al_xIn_yGa_{1-x-y}N$ layer (where 0<x<=y<1, 0<x+y<1), and the barrier layer 61 composed of the $Al_xGa_{1-x}N$ layer (where 0<x<1) with a greater band gap than the $Al_xIn_yGa_{1-x-y}N$ layer (where 0<x<=y<1, 0<x+y<1) as the active layer 60, the transparency over the luminous wavelength can be improved and the tolerance over the heat damage toward a subsequent high temperature process can be improved.
(Final Barrier Layer)

The film thickness of the final barrier layer 610 is formed more thickly than the diffusion length of Mg from the p-type semiconductor layer 80 to the active layer 60.

In the semiconductor light emitting device shown in FIG. 16, the concentration of the p-type impurity of the final barrier layer 610 gradually decreases along to the thickness direction of the final barrier layer 610 from the first principal surface of the final barrier layer 610 which contacts the p-type semiconductor layer 80, and the p-type impurity does not exist in the second principal surface that opposes the first principal surface substantively.

The film thickness $d_0$ of the final barrier layer 610 of the semiconductor light emitting device shown in FIG. 11 is set up as that the p-type impurity diffused in the active layer 60 from the p-type semiconductor layer 80 may not reach the well layer 62 of the active layer 60 after the formation process of the p-type semiconductor layer 80 and its process. That is, the film thickness $d_0$ is set as the thickness which the p-type impurity diffused in the final barrier layer 610 from the p-type semiconductor layer 80 does not reach to the second principal surface (surface where the final barrier layer 610 contacts well layer 62n) that opposes the first principal surface of the final barrier layer 610 which contacts the p-type semiconductor layer 80.

The Mg concentration in the first principal surface of the final barrier layer 610 which contacts the p-type semiconductor layer 80 is, for example about $2\times10^{20}$ $cm^{-3}$, the Mg concentration reduces gradually toward the second principal surface of the final barrier layer 610 which opposes the first principal surface, and the Mg concentration does not have influence of less than about $10^{16}$ cm$^{-3}$ in a position with a distance of about 7 to 8 nm from the first principal surface, thereby becoming not more than the minimum limit of detection community in analysis.

That is, Mg does not diffuse to the second principal surface of the final barrier layer 610 by applying the film thickness $d_0$ of the final barrier layer 610 about 10 nm, and therefore, Mg does not exist in the second principal surface of the final barrier layer 610 which contacts the active layer 60. That is, Mg is not spread in the n$^{th}$ well layer 62n, thereby the reduction of the luminance of the light generated in the active layer 60 is prevented.

In addition, the film thickness d1 to dn of the 1$^{st}$ barrier layer 611 to the n$^{th}$ barrier layer 61n may be the same. However, the hole injected into the active layer 60 from the n-type semiconductor layer 25 needs to reach the n$^{th}$ well layer 62n, and it is necessary to set the film thickness d1 to dn as the thickness which the electron and luminescence by the recombination of a hole may generate in the n$^{th}$ well layer 62n. It is because displacement of the hole in the inside of the active layer 60 is prevented and the luminous efficiency is reduced, if the film thickness d1 to dn of the 1$^{st}$ barrier layer 611 to the n$^{th}$ barrier layer 61n is too thick. For example, the film thickness $d_0$ of the final barrier layer 610 is about 10 nm, the film thickness d1 to dn of the 1$^{st}$ barrier layer 611 to the n$^{th}$ barrier layer 61n is about 7 to 18 nm, and the film thickness of the 1$^{st}$ well layer 621 to the n$^{th}$ well layer 62n is about 2 to 3 nm.

As mentioned above, in the semiconductor light emitting device according to the second embodiment, the film thickness $d_0$ of the final barrier layer 610 which contacts the p-type semiconductor layer 80 is set as the thickness to which the p-type impurity diffused in the active layer 60 from the p-type semiconductor layer 80 does not reach the well layer 62 of the active layer 60. That is, the diffusion of the p-type impurity from the p-type semiconductor layer 80 to the well layer 62 of the active layer 60 can be prevented, controlling increase of the film thickness of the whole of the active layer 60 by setting up more thickly than the diffusion length of Mg the film thickness $d_0$ of the final barrier layer 610, according to the semiconductor light emitting device shown in FIG. 16. As a result, the reduction of the luminance of the light resulting from the diffusion of the p-type impurity to the well layer 62 does not occur, thereby the semiconductor light emitting device by which degradation of the quality of the semiconductor light emitting device is controlled can be fabricated.

(P-Type Semiconductor Layer)

The p-type semiconductor layer 80 is formed of the Al$_x$Ga$_{1-x}$N layer (where 0<=x<1) of about 0.05 micrometer to 1 micrometer of film thickness, which performed impurities doping of the p-type impurity. As the p-type impurity, it is usable in magnesium (Mg), zinc (Zn), cadmium (Cd), calcium (Ca), beryllium (Be), carbon (C), etc.

The configuration example of the p-type semiconductor layer 80 is as follows in detail. That is, the p-type semiconductor layer 80 includes the electron barrier layer 21, the electron cap layer 22, the first nitride based semiconductor layer 81, the second nitride based semiconductor layer 82, the third nitride based semiconductor layer 83, and the fourth nitride based semiconductor layer 84, as shown in FIG. 16. The electron barrier layer 21 is placed on the upper part of the active layer 60, and is composed of an Al$_x$Ga$_{1-x}$N layer (where 0<=x<1) doped with the p-type impurity. The electron cap layer 22 is placed on the electron barrier layer 21, and is composed of an Al$_x$Ga$_{1-x}$N layer (where 0<=x<1) doped with the p-type impurity. The first nitride based semiconductor layer 81 is placed on the electron cap layer 22, and is composed of an Al$_x$Ga$_{1-x}$N layer (where 0<=x<1) by which impurities doping of the p-type impurity is performed. The second nitride based semiconductor layer 82 is placed on the first nitride based semiconductor layer 81, and is composed of an Al$_x$Ga$_{1-x}$N layer (where 0<=x<1) doped with the low-concentration p-type impurity rather than the p-type impurity of the first nitride based semiconductor layer 81. The third nitride based semiconductor layer 83 is placed on the second nitride based semiconductor layer 82, and is composed of an Al$_x$Ga$_{1-x}$N layer (where 0<=x<1) doped with the high-concentration p-type impurity rather than the p-type impurity of the second nitride based semiconductor layer 82. The fourth nitride based semiconductor layer 84 is placed on the third nitride based semiconductor layer 83, and is composed of an Al$_x$Ga$_{1-x}$N layer (where 0<=x<1) doped with the low-concentration p-type impurity rather than the p-type impurity of the third nitride based semiconductor layer 83.

The thickness of the second nitride based semiconductor layer 82 is formed more thickly than the thickness of the first nitride based semiconductor layer 81 or the thickness of the third nitride based semiconductor layer 83 to the fourth nitride based semiconductor layer 84.

At this point, the material and the thickness of each layer are specifically explained. The first nitride based semiconductor layer 81 which is placed in the upper part of the active layer 60, and doped with the p-type impurity is formed, for example by a p-type Al$_x$Ga$_{1-x}$N layer (where 0<=x<1) about 40 nm thick in Mg by about $1.3 \times 10^{20}$ cm$^{-3}$ by which impurities doping is performed.

The second nitride based semiconductor layer 82 which is placed on the first nitride based semiconductor layer 81, and doped with the low-concentration p-type impurity rather than the p-type impurity of the first nitride based semiconductor layer 81 is formed, for example by a p-type Al$_x$Ga$_{1-x}$N layer (where 0<=x<1) about 90 nm thick in Mg by about $2.7 \times 10^{19}$ cm$^{-3}$ by which impurities doping is performed.

The third nitride based semiconductor layer 83 which is placed on the second nitride based semiconductor layer 82, and doped with the high-concentration p-type impurity rather than the p-type impurity of the second nitride based semiconductor layer 82 is formed, for example by a p-type Al$_x$Ga$_{1-x}$N layer (where 0<=x<1) about 20 nm thick in Mg by about $1.2 \times 10^{20}$ cm$^{-3}$ by which impurities doping is performed.

The fourth nitride based semiconductor layer 84 which is placed on the third nitride based semiconductor layer 83, and doped with the low-concentration p-type impurity rather than the p-type impurity of the third nitride based semiconductor layer 83 is formed, for example by a p-type Al$_x$Ga$_{1-x}$N layer (where 0<=x<1) about 5 nm thick in Mg by less than about $5 \times 10^{19}$ cm$^{-3}$ by which impurities doping is performed. The fourth nitride based semiconductor layer 84 functions as a p-type contact layer.

In the semiconductor light emitting device according to the second embodiment, the p-type semiconductor layer 80 formed on the active layer 60 is composed of the p-type Al$_x$Ga$_{1-x}$N layers (where 0<=x<1) of 4 tiered structure from which Mg concentration differs, as mentioned above, and is doped with the above-mentioned concentration. The p-type Al$_x$Ga$_{1-x}$N (where 0<=x<1) layer grows at low temperature about 800 degrees C. to 900 degrees C. in order to reduce the heat damage to the active layer 60.

Since light emitting power becomes high so that Mg concentration is high, the first nitride based semiconductor layer 81 nearest to the active layer 60 is so preferable that Mg concentration is high.

As for the second nitride based semiconductor layer 82, since the crystal defect resulting from Mg increases and membranous resistance becomes high if it performs impurities doping of Mg too much, it is preferable that the Mg concentration is about the middle of the level of $10^{19}$ cm$^{-3}$.

Since the third nitride based semiconductor layer 83 is a layer which determines the amount of hole injections to the active layer 60, its Mg concentration slightly higher than the second nitride based semiconductor layer 82 is preferable.

Figure 17:
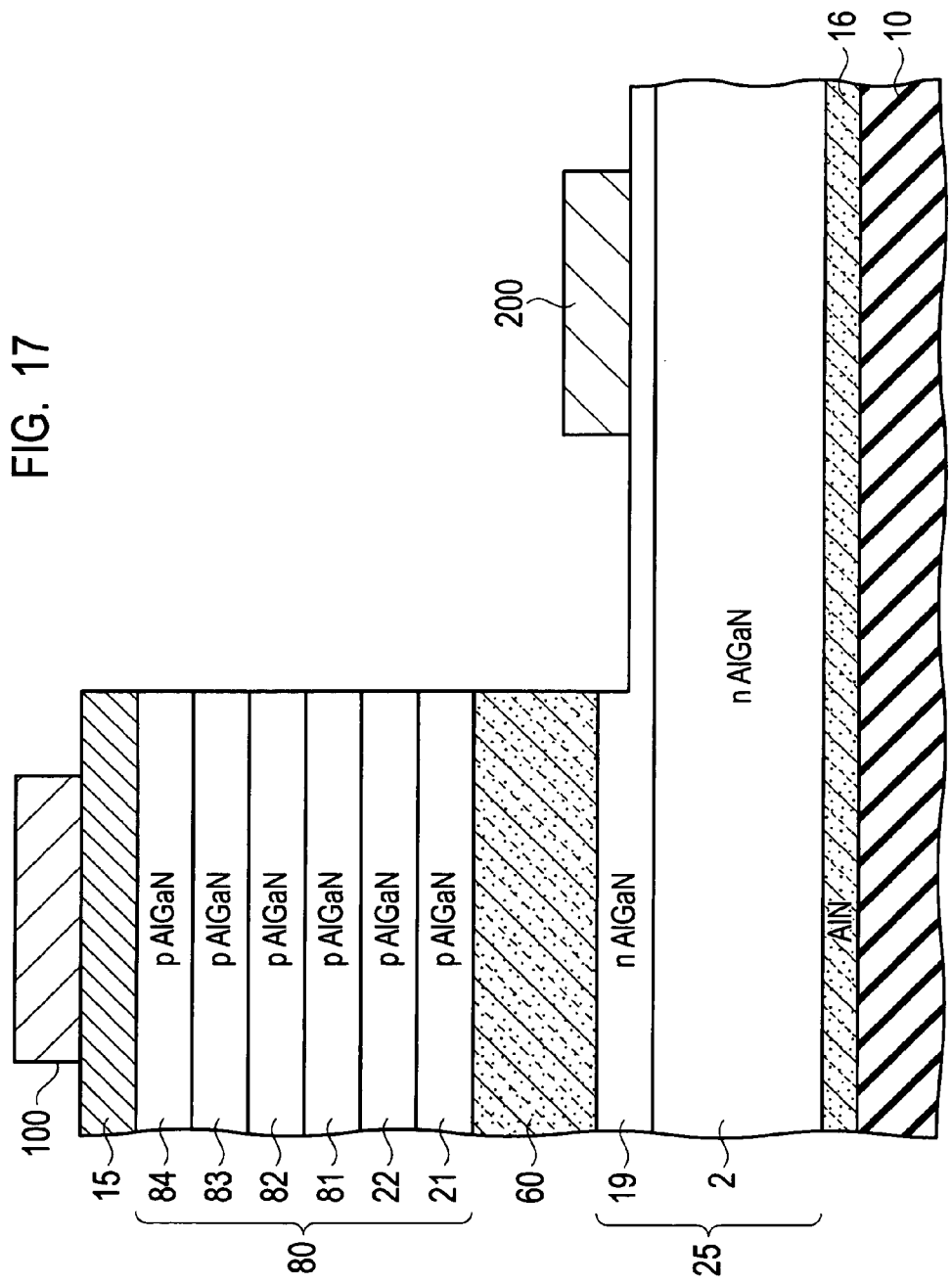
FIG. 17 is a schematic cross-sectional configuration chart formed to a p-side electrode and an n-side electrode of the semiconductor light emitting device according to the second embodiment of the present invention.

As shown in FIG. 17, the fourth nitride based semiconductor layer 84 is the p-type AlGaN layer for reserving ohmic contact with the transparent electrode 15, and is made depletion substantially. As the transparent electrode 15, when the ZnO electrode by which impurities doping of Ga or Al is performed about $1\times10^{19}$ to $5\times10^{21}$ cm$^{-3}$ is used, the impurities doping of Mg is performed at the fourth nitride based semiconductor layer 84, for example so that it may become the Mg concentration at the time when most reducing the forward voltage $V_f$ of the semiconductor light emitting device.

When growing up two layers of the p-type $Al_xGa_{1-x}N$ layers (where $0<=x<1$), since the third nitride based semiconductor layer 83 and the fourth nitride based semiconductor layer 84 near the p-side electrode 100 need to raise the hole concentration in the film, they increase $H_2$ gas volume in the carrier gas. Moreover, the first nitride based semiconductor layer 81 and the second nitride based semiconductor layer 82 near the active layer 60 do not have to increase the $H_2$ gas volume in the carrier gas, and are made to perform crystal growth by the extension into which the active layer 60 is grown up by the $N_2$ carrier gas. When growing up these p-type $Al_xGa_{1-x}N$ layers (where $0<=x<1$), the way which made the V/III ratio as high as possible can grow up the film which is lower resistance, and can drop the forward voltage ($V_f$) of the light emitting device.

According to the semiconductor light emitting device according to the second embodiment, by forming the p-type semiconductor layer at low temperature, reducing the heat damage to the active layer and forming the p-type semiconductor layer rather than the GaN layer by the large $Al_xGa_{1-x}N$ layer (where $0<=x<1$) of the band gap, the transparency over the luminous wavelength is improved, and the forward voltage ($V_f$) can be reduced and the luminous efficiency can be improved.

(Electrode Structure)

Figure 18:
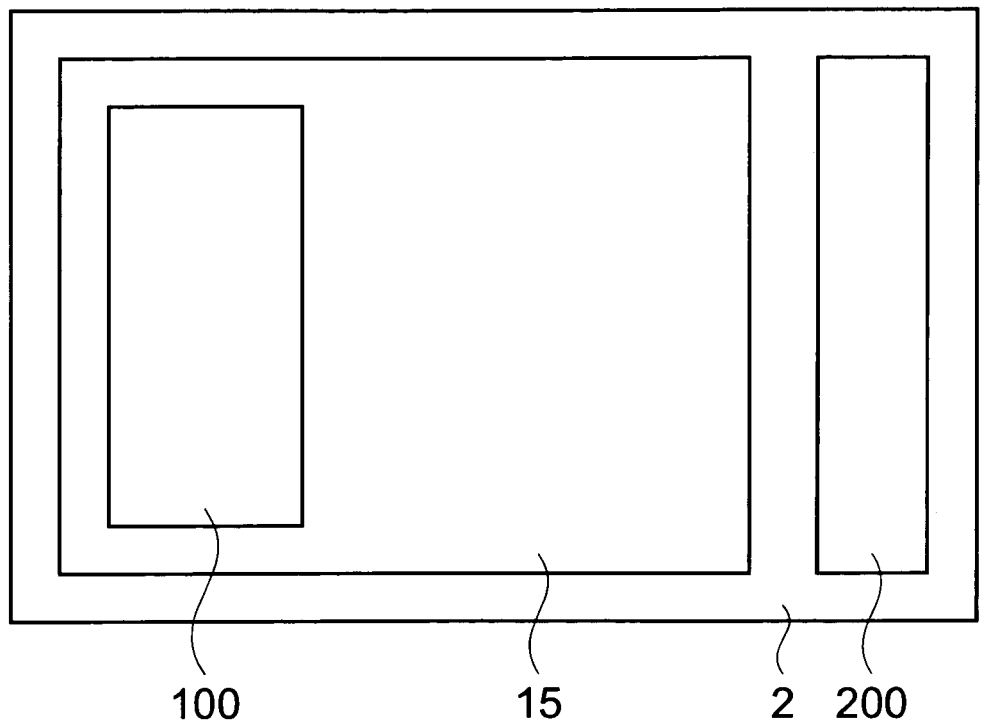
FIG. 18 is a schematic plane pattern configuration diagram in the semiconductor light emitting device according to the second embodiment of the present invention, and corresponding to FIG. 17.

The semiconductor light emitting device according to the second embodiment further includes an n-side electrode 200 which apply voltage to the n-type semiconductor layer 25, and a p-side electrode 100 which applies voltage to the p-type semiconductor layer 80, as shown in FIG. 17 and FIG. 18. As shown in FIG. 17, the n-side electrode 200 is placed on the surface of the p-type semiconductor layer 80, the active layer 60, and the n-type contact layer 19 that performed the mesa etching of the partial region of the n-type contact layer 19, and is exposed.

The p-side electrode 100 is placed through the transparent electrode 15 on the p-type semiconductor layer 80. Or again, the p-side electrode 100 may be directly placed on the p-type semiconductor layer 80. Or again, the p-side electrode 100 may be placed on an opening which opening a window toward the transparent electrode 15.

The transparent electrode 15 placed on the fourth nitride based semiconductor layer 84 includes either of the ZnO, ITO, or ZnO containing indium, for example.

The n-side electrode 200 is composed, for example of a multilayer film of Al film, Ti/Au/Ni film, Al/Ti/Au film, Al/Ni/Au film, Al/Ti/Ni/Au film, Al/Ni1/Ti/Au film, Al/Ni/Ti/Ni/Au film or Au—Sn/Au/Ti/Ni/Al film and Au—Sn/Au/Ni/Ti/Ni/Al film from the upper layer.

The p-side electrode 100 is composed, for example of a multilayer film of Al film, palladium (Pd)-gold (Au) alloy film, Ni/Ti/Au film, Ti/Au/Ti/Au film, Ti/Au/NI/Ti/Ni/Au film, Ti/Ni/Au/Ti/Ni/Au film, or Au—Sn/Ti/Au film, Au—Sn/Au film, Au—Sn/Au/Ti/Au/Ti film, Au—Sn/Au/Ni/Ti/Ni/Au/Ti film, and Au—Sn/Au/Ni/Ti/Au/Ni/Ti film from the upper layer. And ohmic contact of the n-side electrode 200 is performed to the n-type semiconductor layer 25, and ohmic contact of the p-side electrode 100 is performed to the p-type semiconductor layer 80 through the transparent electrode 15, respectively.

Figure 19:
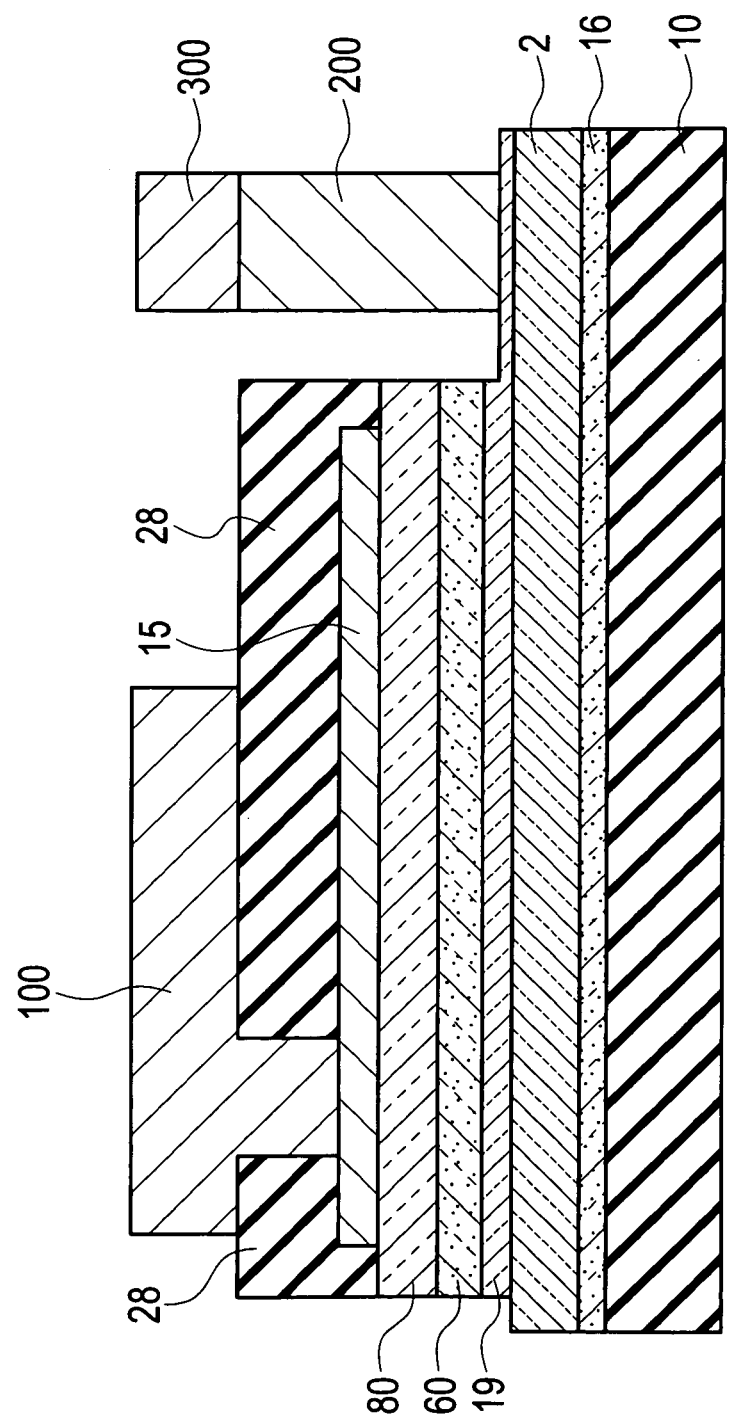
FIG. 19 is a schematic cross-sectional configuration chart according to a flip chip configuration, in the semiconductor light emitting device according to the second embodiment of the present invention.

In FIG. 19, in order that the semiconductor light emitting device according to the second embodiment is mounted on flip chip structure, by forming an n-side electrode 300 further on the n-side electrode 200, the surface of the p-side electrode 100 and the surface of the n-side electrode 300 are formed so that the height measured from the substrate 10 may constitute the substantially same height.

The structure of FIG. 19 forms the transparent conducting film ZnO as the transparent electrode 15, and is provided with a structure, which wraps this ZnO by the reflective stacked film 28. The reflective stacked film 28 reflects toward the wavelength of the light, which emits.

Moreover, it may provide a structure, which covers the transparent electrode 15 with an insulating film, and wraps the insulating film by the reflective stacked film 28, which reflects toward the wavelength λ of the light, which emits.

The reflective stacked film 28 has the layered structure of $\lambda/4n_1$ and $\lambda/4n_2$ (where $n_1$ and $n_2$ are refractive indices of a layer to laminate). As a material used for layered structure, the layered structure composed of $ZrO_2$ (n=2.12) and $SiO_2$ (n=1.46) can be used, for example toward λ=450 nm blue light. The thickness of each layer in this case sets $ZrO_2$ to about 53 nm, and sets $SiO_2$ to about 77 nm, for example. $TiO_2$, $Al_2O_3$, etc. can also be used as other materials for forming the layered structure.

According to the semiconductor light emitting device according to the second embodiment, since the light which emitted light within the active layer 30 by the reflective stacked film 28 can be extracted from the substrate 10 side external, without being absorbed by the p-side electrode 100, outward luminous efficiency can be improved.

The flip chip structure become the path which extracts the light from the AlGaN layer side to the external through the sapphire substrate 10 is effective at the point which may improve in particular outward luminous efficiency. By creating the substrate in which the protective film 18 in which refractive indices differ partially is formed to up to the different species substrate 10, growing the AlGaN layer epitaxially to the above-mentioned substrate 10 on this, and forming the light emitting device, unevenness can be formed on the interface between the epitaxial growth layer and the substrate, dispersion and diffraction of light occur, and optical extraction efficiency can be improved.

According to the semiconductor light emitting device according to the second embodiment, since dope Al to the n-type semiconductor layer 25, the active layer 60, and the p-type semiconductor layer 80, and a heat damage is decreased and the transparency over the luminous wavelength is improved and the light which emits within the active layer 60 by the reflective stacked film 28 can be extracted external without being absorbed by the p-side electrode 100, the outward luminous efficiency can be improved.

(Fabrication Method)

Hereinafter, an example of the fabrication method of the semiconductor light emitting device shown in FIG. 16 according to the second embodiment will be explained. In addition, the fabrication method of the semiconductor light emitting device described in the following is an example, and, of course, it can achieve with various fabrication methods except this method, including this modified example. Here, an example, which applies the sapphire substrate to the substrate 10, will be explained.

(a) First of all, grow up the AlN buffer layer 16 on the sapphire substrate 10 exposed by the MOCVD (Metal Organic Chemical Vapor Deposition) method etc., which are well known. For example, by supplying trimethyl aluminum (TMA) and ammonia ($NH_3$) to a reaction chamber by applying $H_2$ gas as a carrier in high temperature (about 900 degrees C. to about 950 degrees C.), thin AlN buffer layer 16 about 10 to 50 angstrom thick is grown up for a short time.

(b) Next, grow up the n-type nitride based semiconductor layer 2 by which the impurities doping of the n-type impurity is performed on the AlN buffer layer 16 by the MOCVD method etc. For example, after performing thermal cleaning of the substrate 10 in which the AlN buffer layer 16 is formed, the substrate temperature is set as the about 1000 degrees C., and about 1 to 5 micrometers of the n-type nitride based semiconductor layers 2 composed of the $Al_xGa_{1-x}N$ layer (where $0<x<1$) which performs the impurities doping of the n-type impurity are grown up on the AlN buffer layer 16. In the n-type nitride based semiconductor layer 2, the impurities are doped with Si by about $3\times10^{18}$ $cm^{-3}$ concentration, for example as the n-type impurity. When performing the impurities doping of the Si, trimethylgallium (TMG), ammonia ($NH_3$), and Silane ($SiH_4$) are supplied as material gas, and then the n-type $Al_xGa_{1-x}N$ layer (where $0<x<1$) is formed.

(c) Next, form about 1550 nm of n-type contact layer 19 on the n-type nitride based semiconductor layer 2, for example. In the n-type contact layer 19, the impurities are doped with Si by about $3\times10^{18}$ $cm^{-3}$ concentration, for example as the n-type impurity.

(d) Next, form the active layer 60 on the n-type semiconductor layer 25 (2, 19). For example, the barrier layer 61 composed of the $Al_xGa_{1-x}N$ layer (where $0<x<1$), and the well layer 62 composed of the $Al_xIn_yGa_{1-x-y}N$ layer (where $0<x<=y<1$, $0<x+y<1$) are laminated by turns, and then the active layer 60 is formed. More specifically, adjusting the substrate temperature and the flow rate of material gas at the time of forming the active layer 60, the barrier layer 61 and the well layer 62 are grown up continuously by turns, and the active layer 60 which the barrier layer 61 and the well layer 62 laminate is formed. That is, the process of laminating the well layer 62 and the barrier layer 61 with a larger band gap than the well layer 62 is applied a unit process by adjusting substrate temperature and the flow rate of material gas, and this unit process is repeated n times (for example, about 8 times), and the layered structure which the barrier layer 61 and the well layer 62 laminate by turns is obtained.

When forming the barrier layer 61, TMG gas, TMA gas, and $NH_3$ gas are supplied to a processing unit for film formation as the material gas, respectively, for example. On the other hand, when forming the well layer 62, TMG gas, TMA gas, trimethylindium (TMI) gas, and $NH_3$ gas are supplied to the processing unit as material gas, respectively, for example. In addition, TMG gas is supplied as the material gas of a Ga atom, TMI gas is supplied as the material gas of In atom, TMA gas is supplied as the material gas of Al atom, and $NH_3$ gas is supplied as the material gas of a nitrogen atom.

On the formed layered structure, about 10 nm of the $Al_xGa_{1-x}N$ layer (where $0<x<1$) non-doped as the final barrier layer 610 are formed, and the active layer 60 shown in FIG. 16 or FIG. 17 is formed. As already explained above, the film thickness $d_0$ of the final barrier layer 610 is set as the thickness to which the p-type dopant diffused in the active layer 60 from the p-type semiconductor layer 80 does not reach the well layer 62 of the active layer 60.

(e) Next, the substrate temperature is set to 800 degrees C. to degree 900 degrees C., and form about 0.05 to 1 micrometer of p-type semiconductor layers 80 which performed impurities doping of the p-type impurity on the final barrier layer 610.

When performing impurities doping of Mg as the p-type impurity, TMG gas, TMA gas, $NH_3$ gas, and bis(cyclopentadienyl) magnesium ($Cp_2Mg$) gas are supplied as material gas, and the p-type semiconductor layer 80 (21, 22 and 81-84) is formed. Mg is prevented from being spread in the well layer 62 of the active layer 60 by the final barrier layer 610 although Mg is spread in the active layer 60 from the p-type semiconductor layer 80 at the time of formation of the p-type semiconductor layer 80.

(f) Next, form the transparent electrode 15 on the upper part of the p-type semiconductor layer 80 by vacuum evaporation, sputtering technology, etc. As the transparent electrode 15, either of the ZnO, ITO, or ZnO containing indium can be used, for example. Furthermore, it may perform impurities doping of the n-type impurities, such as Ga or Al, at high concentration to about $1\times10^{19}$ to $5\times10^{21}$ $cm^{-3}$.

(i) Next, form the reflective stacked film 28 reflected toward the wavelength λ of the light, which emits so that the transparent electrode 15 may be covered by vacuum evaporation, sputtering technology, etc. after patterning the transparent electrode 15.

(h) Next, perform and remove mesa etching even of the halfway of the reflective stacked film 28 and the p-type semiconductor layer 80 to the n-type semiconductor layer 25 by using etching technology, such as RIE (Reactive Ion Etching), and expose the surface of the n-type contact layer 19.

(i) Next, form the n-side electrodes 200 and 300 on the surface of the exposed n-type contact layer 19 by vacuum evaporation, sputtering technology, etc. Also toward the transparent electrode 15 on the p-type semiconductor layer 80, the p-side electrode 100 is formed by vacuumed vaporation, sputtering technology, etc. after the pattern formation, and the semiconductor light emitting device shown in FIG. 17 or FIG. 19 is completed.

Modified Example

As a modified example of the second embodiment, the structure composed of the electron barrier layer 21, the electron cap layer 22, the third nitride based semiconductor layer 83, and the fourth nitride based semiconductor layer 84 may be provided as the p-type semiconductor layer 80 placed on the upper part of the active layer 60. The electron barrier layer 21 is placed on the upper part of the active layer 60, and is composed of an $Al_xGa_{1-x}N$ layer (where $0<=x<1$) by which the impurities doping of the p-type impurity is performed. The electron cap layer 22 is placed on the electron barrier layer 21, and is composed of an $Al_xGa_{1-x}N$ layer (where $0<=x<1$) by which the impurities doping of the p-type impurity is performed. The third nitride based semiconductor layer 83 is placed on the electron cap layer 22, and doped with the p-type impurity. The fourth nitride based semiconductor layer 84 is placed on the third nitride based semiconductor layer 83, and doped with a low-concentration p-type impurity rather than the p-type impurity of the third nitride based semiconductor layer 83.

The third nitride based semiconductor layer 83 is formed, for example by the p-type $Al_xGa_{1-x}N$ layer (where $0<=x<1$)

about 20 nm thick at about $1.2 \times 10^{20}$ cm$^{-3}$ by which the impurities doping of Mg is performed.

The fourth nitride based semiconductor layer 84 that is placed on the third nitride based semiconductor layer 83, and doped with a low-concentration p-type impurity rather than the p-type impurity of the third nitride based semiconductor layer 83 is formed, for example by the p-type Al$_x$Ga$_{1-x}$N layer (where 0<=x<1) about 5 nm thick at less than about $5 \times 10^{19}$ cm$^{-3}$ by which the impurities doping of Mg is performed.

In the semiconductor light emitting device according to the modified example of the second embodiment, the p-type semiconductor layer 80 formed on the active layer 60 is composed of the p-type Al$_x$Ga$_{1-x}$N layer (where 0<=x<1) of the structure where Mg concentration differs, as mentioned above, and is doped with the above-mentioned concentration. The p-type Al$_x$Ga$_{1-x}$N layer (where 0<=x<1) grows at low temperature about 800 degrees C. to 900 degrees C. in order to reduce the heat damage to the active layer 60.

Since the third nitride based semiconductor layer 83 is a layer which determines the amount of hole injections to the active layer 60, the light emitting power becomes high, so that the Mg concentration is high. For this reason, Mg concentration is so preferable that it is high.

The fourth nitride based semiconductor layer 84 is a p-type Al$_x$Ga$_{1-x}$N layer (where 0<=x<1) for reserving ohmic contact with the transparent electrode 15, and is made depletion substantially. For example, when the ZnO electrode by which impurities doping of Ga or Al is performed about $1 \times 10^{19}$ to $5 \times 10^{21}$ cm$^{-3}$ is used as the transparent electrode 15, the impurities doping of Mg is performed at the fourth nitride based semiconductor layer 84 so that it may become Mg concentration at the time when dropping most the forward voltage V$_f$ of the semiconductor light emitting device.

Also in the semiconductor light emitting device according to the modified example of the second embodiment, since the AlN buffer layer 16, the n-type semiconductor layer 25, the active layer 60, the p-type semiconductor layer 80 (20, 21, 83, 84), the final barrier layer 610, the reflective stacked film 28, and the electrode structure are the same as that of the semiconductor light emitting device according to the second embodiment, the description is omitted.

According to the semiconductor light emitting device according to the second embodiment and its modified example, the semiconductor light emitting device and a fabrication method for the semiconductor light emitting device which is doped with Al in all the layers of the n-type semiconductor layer, the active layer, and the p-type semiconductor layer, decreases the heat damage, and improves the transparency over the luminous wavelength, and whose the outward luminous efficiency is improved, can be provided.

Third Embodiment (Element Structure)

Figure 20:
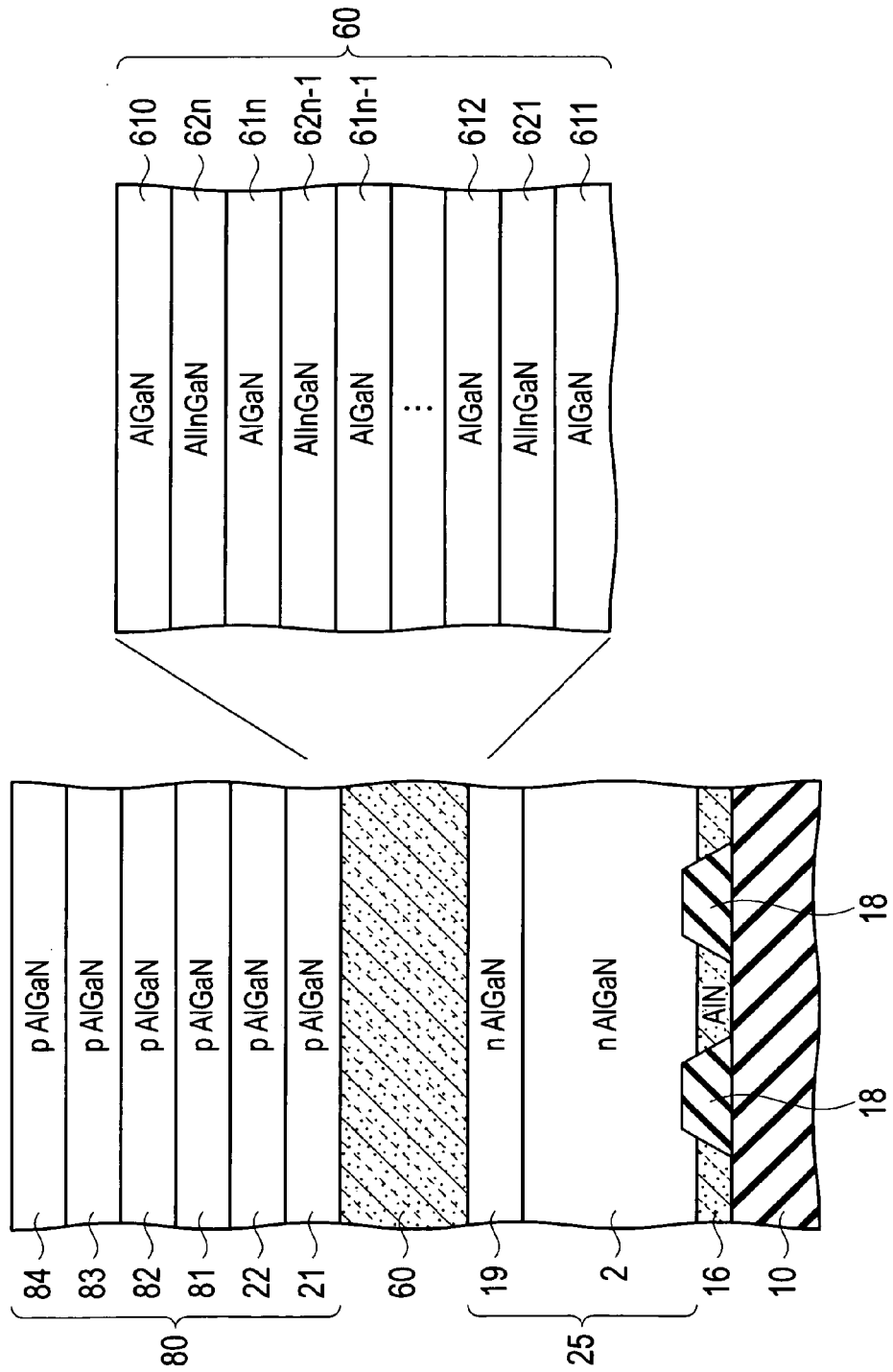
FIG. 20 is a schematic cross-sectional configuration chart of a semiconductor light emitting device according to a third embodiment of the present invention, and is a schematic cross-sectional configuration chart to which a semiconductor light emitting device part and an active layer part are enlarged.

A semiconductor light emitting device according to a third embodiment of the present invention includes a substrate 10, a protective film 18, an AlN buffer layer 16, an n-type semiconductor layer 25, an active layer 60, and a p-type semiconductor layer 80, as shown in FIG. 20. The protective film 18 is placed on the substrate 10. The AlN buffer layer 16 is placed on the substrate 10 pinched by the protective film 18. The n-type semiconductor layer 25 is placed on the AlN buffer layer 16 and the protective film 18, and is composed of an Al$_x$Ga$_{1-x}$N layer (where 0<x<1) by which the impurities doping of the n-type impurity is performed. The active layer 60 is placed on the n type semiconductor layer 25, and is composed of a MQW having a layered structure by which the well layer composed of a barrier layer composed of an Al$_x$Ga$_{1-x}$N layer (where 0<x<1) and an Al$_x$In$_y$Ga$_{1-x-y}$N layer (where 0<x<=y<1, 0<x+y<1) in which a band gap is smaller than the barrier layer is placed by turns. The p-type semiconductor layer 80 is placed on the active layer 60, and is composed of an Al$_x$Ga$_{1-x}$N layer (where 0<=x<1) by which impurities doping of the p-type impurity is performed.

The active layer 60 has a layered structure by which the barrier layer 611 to 61n, 610, and the well layer 621 to 62n are placed by turns, as shown in FIG. 20. The barrier layer 611 to 61n, and 610 are composed of an Al$_x$Ga$_{1-x}$N layer (where 0<x<1). The well layer 621 to 62n are composed of an Al$_x$In$_y$Ga$_{1-x-y}$N layer (where 0<x<=y<1, 0<x+y<1) in which a band gap is smaller than the barrier layer 611 to 61n and 610.

(Electrode Structure)

Figure 21:
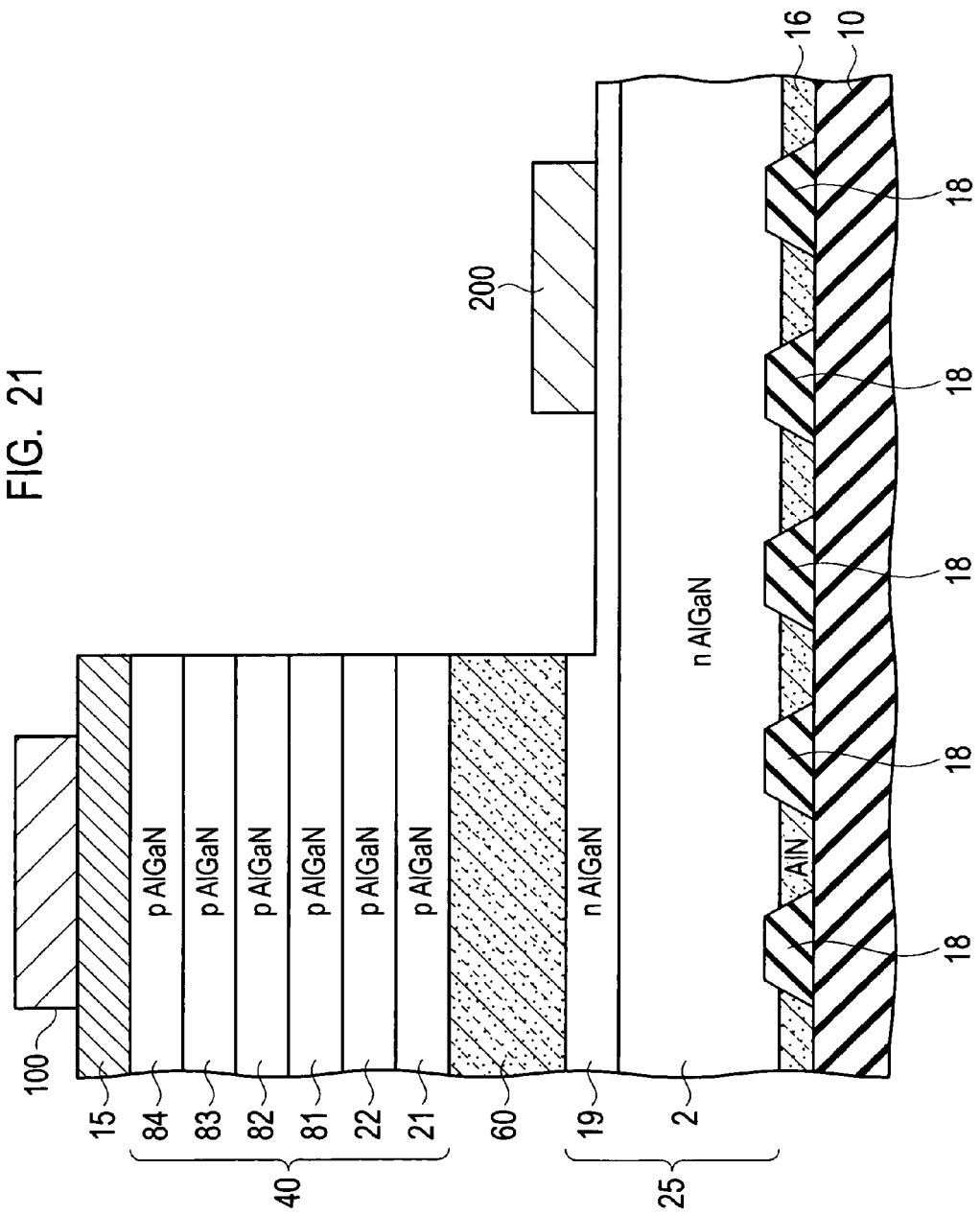
FIG. 21 is a schematic cross-sectional configuration chart formed to a p-side electrode and an n-side electrode of the semiconductor light emitting device according to the third embodiment of the present invention.

The semiconductor light emitting device according to the third embodiment further includes an n-side electrode 200 which apply voltage to the n-type semiconductor layer 25, and a p-side electrode 100 which applies voltage to the p-type semiconductor layer 80, as shown in FIG. 21. As shown in FIG. 21, the n-side electrode 200 is placed on the surface of the p-type semiconductor layer 80, the active layer 60, and the n-type contact layer 19 that performed the mesa etching of the partial region of the n-type contact layer 19 and is exposed.

Figure 22:
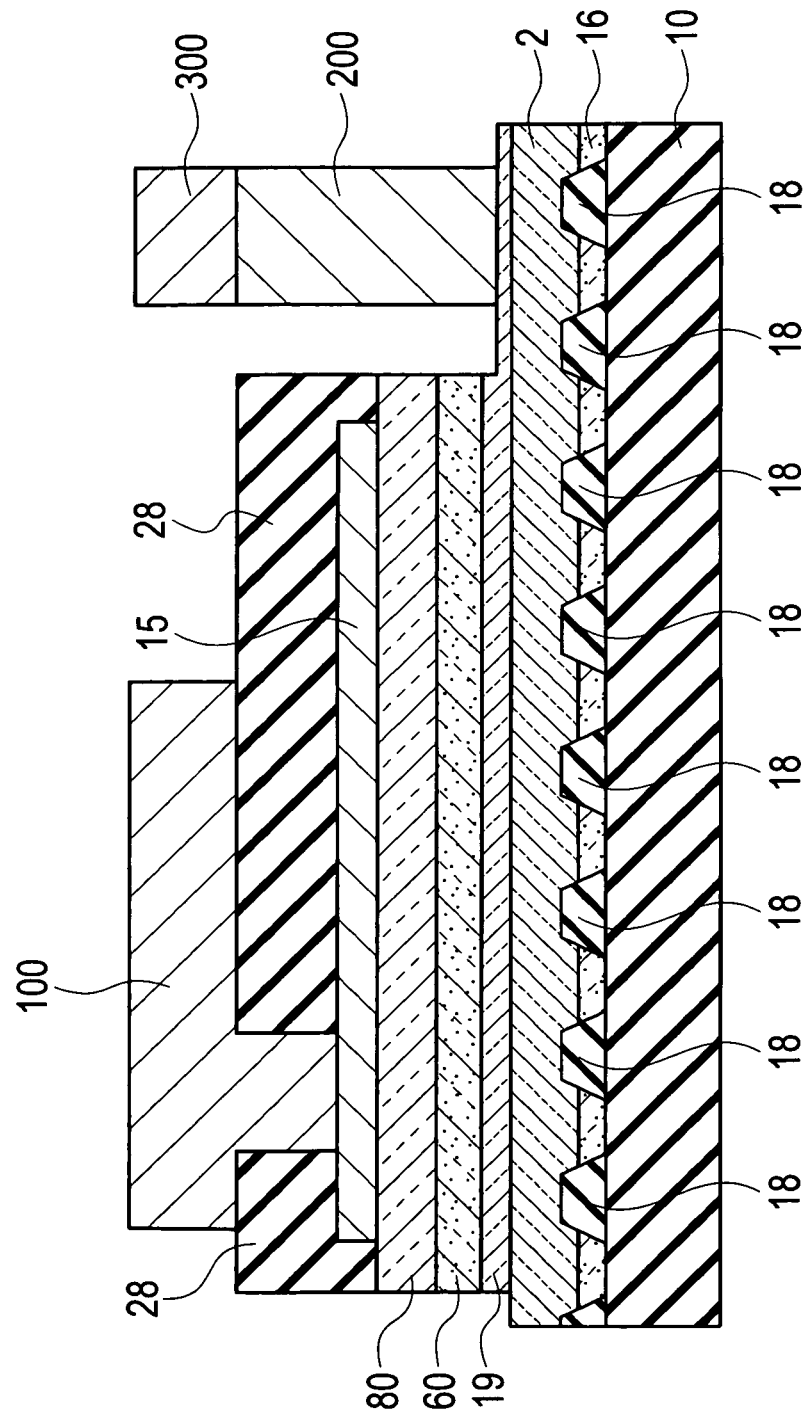
FIG. 22 is a schematic cross-sectional configuration chart according to a flip chip configuration, in the semiconductor light emitting device according to the third embodiment of the present invention.

In FIG. 22, in order that the semiconductor light emitting device according to the third embodiment is mounted on flip chip structure, by forming an n-side electrode 300 further on the n-side electrode 200, the surface of the p-side electrode 100 and the surface of the n-side electrode 300 are formed so that the height measured from the substrate 10 may constitute the substantially same height.

The structure of FIG. 22 forms the transparent conducting film ZnO as the transparent electrode 15, and is provided with a structure, which wraps this ZnO by the reflective stacked film 28. The reflective stacked film 28 reflects toward the wavelength of the light, which emits.

Moreover, it may provide a structure, which covers the transparent electrode 15 with an insulating film, and wraps the insulating film by the reflective stacked film 28, which reflects toward the wavelength λ of the light, which emits.

(Fabrication Method)

A fabrication method of the semiconductor light emitting device according to the third embodiment includes: a process of forming a protective film on a substrate; a process of forming an AlN buffer layer on the substrate pinched by the protective film; a process of forming an n-type semiconductor layer composed of an Al$_x$Ga$_{1-x}$N layer (where 0<x<1) by which impurities doping of an n-type impurity is performed, on the AlN buffer layer and the protective film; a process of forming the active layer composed of a MQW having a layered structure formed of a barrier layer composed of an Al$_x$Ga$_{1-x}$N layer (where 0<x<1) and a well layer composed of an Al$_x$In$_y$Ga$_{1-x-y}$N layer (where 0<x<=y<1, 0<x+y<1) in which a band gap is smaller than the barrier layer by turns, on the n-type semiconductor layer; and a process of forming the p type semiconductor layer composed of an Al$_x$Ga$_{1-x}$N layer (where 0<=x<1) by which the impurities doping of a p-type impurity is performed, on the active layer.

According to the semiconductor light emitting device according to the third embodiment, the semiconductor light emitting device and a fabrication method for the semiconductor light emitting device which is doped with Al in all the layers of the n-type semiconductor layer, the active layer, and the p-type semiconductor layer, decreases the heat damage, and improves the transparency over the luminous wavelength, and whose the outward luminous efficiency is improved, can be provided.

Other Embodiments

While the present invention is described in accordance with the aforementioned first through third embodiments and those modified examples, it should not be understood that the description and drawings that configure part of this disclosure are to limit the present invention. This disclosure makes clear a variety of alternative embodiments, working examples, and operational techniques for those skilled in the art.

Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

In description of the already described embodiments, although the example of the active layer 30 composed of the MQW which has the layered structure by which the barrier layer 31 composed of an $Al_xGa_{1-x}N$ layer (where $0<x<1$) and the well layer 32 composed of an $Al_xIn_yGa_{1-x-y}N$ layer (where $0<x<=y<1$, $0<x+y<1$) in which the band gap is smaller than the barrier layer 31 is placed by turns is shown, it may be the structure which applied thicker than the diffusion length of Mg to the film thickness $d_0$ of the final barrier layer 310 placed between the well layer 32 and the p-type semiconductor layer 40, including the one well layer 32 which the active layer 30 composed of the $Al_xIn_yGa_{1-x-y}N$ layer (where $0<x<=y<1$, $0<x+y<1$).

Thus, the present invention includes various embodiments etc., which have not been described in this specification.

INDUSTRIAL APPLICABILITY

The semiconductor light emitting device of the present invention is available in whole nitride based semiconductor elements, such as an LED element, an LD element, etc. provided with the quantum well structure.

What is claimed is:

1. A semiconductor light emitting device comprising:
   a substrate having a principal surface;
   a protective film placed on the substrate, the protective film having a window section, wherein the protective film and the substrate are made of different materials from each other;
   a buffer layer placed on the window section of the protective film on the substrate;
   an n-type semiconductor layer placed on the buffer layer and on the protective film, and doped with an n-type impurity,
   wherein the protective film has protrusions that protrude from the principal surface into the n-type semiconductor layer to form a concave portion of the n-type semiconductor layer between the protrusions thereby forming an uneven interface between the n-type semiconductor layer and the protective film, the interface being disposed between part of the n-type semiconductor layer and the substrate;
   an active layer placed on the n-type semiconductor layer; and
   a p-type semiconductor layer placed on the active layer and doped with a p-type impurity.

2. The semiconductor light emitting device according to claim 1 further comprising:
   a transparent electrode placed on the p-type semiconductor layer;
   an n-side electrode placed on a surface of the n-type semiconductor layer exposed by removing a part of the transparent electrode, a part of the p-type semiconductor layer, a part of the active layer, and a part of the n-type semiconductor layer; and
   a p-side electrode placed on the transparent electrode.

3. The semiconductor light emitting device according to claim 2, further comprising a reflective stacked film placed on the transparent electrode.

4. The semiconductor light emitting device according to claim 3, wherein the protective film is transparent toward a luminous wavelength, and a refractive index of the protective film is almost equal to a refractive index of the substrate.

5. The semiconductor light emitting device according to claim 4, wherein
   the protective film is one of a silicon dioxide film, a silicon nitride film, a silicon oxynitride film, a titanium oxide film, and an alumina film.

6. A semiconductor light emitting device comprising:
   a substrate having a principal surface;
   a protective film placed on the substrate, the protective film having a window section, wherein the protective film and the substrate are made of different materials from each other;
   an AlN buffer layer placed on the window section of the protective film on the substrate;
   an n-type semiconductor layer placed on the AlN buffer layer and the protective film, and doped with an n-type impurity,
   wherein the protective film has protrusions that protrude from the principal surface into the n-type semiconductor layer to form a concave portion of the n-type semiconductor layer between the protrusions thereby forming an uneven interface between the n-type semiconductor layer and the protective film, the interface being disposed between part of the n-type semiconductor layer and the substrate;
   a block layer placed on the n-type semiconductor layer, and doped with an n-type impurity having a concentration lower than that of the n-type semiconductor layer;
   an active layer placed on the block layer, the active layer being composed of a multiple quantum well having a layered structure in which a barrier layer and a well layer in which a band gap is smaller than that of the barrier layer are placed by turns, the multiple quantum well including indium;
   a first nitride based semiconductor layer placed on the active layer and doped with a p-type impurity;
   a second nitride based semiconductor layer placed on the first nitride based semiconductor layer, and doped with a low-concentration p-type impurity that has a concentration lower than that of the p-type impurity of the first nitride based semiconductor layer;
   a third nitride based semiconductor layer that is placed on the second nitride based semiconductor layer, and doped with a high-concentration p-type impurity that has a higher concentration than that of the p-type impurity of the second nitride based semiconductor layer; and
   a fourth nitride based semiconductor layer placed on the third nitride based semiconductor layer, and doped with a low-concentration p-type impurity that has a lower concentration than that of the p-type impurity of the third nitride based semiconductor layer, wherein
   the film thickness of a final barrier layer of the top layer of the layered structure is thicker than a diffusion length of the p-type impurity of the first nitride based semiconductor layer.

7. A semiconductor light emitting device comprising:
a substrate having a principal surface;
a protective film placed on the substrate, the protective film having a window section, wherein the protective film and the substrate are made of different materials from each other;
an AlN buffer layer placed on the window section of the protective film on the substrate;
an n-type semiconductor layer placed on the AlN buffer layer and the protective film, and doped with an n-type impurity,
wherein the protective film has protrusions that protrude from the principal surface into the n-type semiconductor layer to form a concave portion of the n-type semiconductor layer between the protrusions thereby forming an uneven interface between the n-type semiconductor layer and the protective film, the interface being disposed between part of the n-type semiconductor layer and the substrate;
a block layer placed on the n-type semiconductor layer, and doped with an n-type impurity that has a concentration that is lower than that of the n-type semiconductor layer;
an active layer placed on the block layer, the active layer being composed of a multiple quantum well having a layered structure in which a barrier layer and a well layer in which a band gap is smaller than that of the barrier layer are placed by turns, the multiple quantum well including indium;
a first nitride based semiconductor layer placed on the active layer and doped with a p-type impurity;
a second nitride based semiconductor layer placed on the first nitride based semiconductor layer, and doped with a low-concentration p-type impurity having a lower concentration than that of the p-type impurity of the first nitride based semiconductor layer; and
a transparent electrode placed on the second nitride based semiconductor layer, wherein
the film thickness of a final barrier layer of the top layer of the layered structure is thicker than a diffusion length of the p-type impurity of the first nitride based semiconductor layer.

8. The semiconductor light emitting device according to claim 7, further comprising a reflective stacked film placed on the transparent electrode.

9. The semiconductor light emitting device according to claim 7, wherein the protective film is transparent toward a luminous wavelength, and a refractive index of the protective film is almost equal to a refractive index of the substrate.

10. The semiconductor light emitting device according to claim 9, wherein the semiconductor light emitting device has a flip chip structure, and a light reflected by the reflective stacked film is extracted from the substrate side.

11. A semiconductor light emitting device comprising:
a substrate having a principal surface;
a protective film placed on the substrate, the protective film having a window section, wherein the protective film and the substrate are made of different materials from each other;
an AlN buffer layer placed on the window section of the protective film on the substrate;
an n-type semiconductor layer placed on the AlN buffer layer, and composed of an $Al_xGa_{1-x}N$ layer (where $0<x<1$) doped with an n-type impurity,
wherein the protective film has protrusions that protrude from the principal surface into the n-type semiconductor layer to form a concave portion of the n-type semiconductor layer between the protrusions thereby forming an uneven interface between the n-type semiconductor layer and the protective film, the interface being disposed between part of the n-type semiconductor layer and the substrate;
an active layer placed on the n-type semiconductor layer, the active layer composed of a multiple quantum well having a layered structure in which a well layer composed of a barrier layer composed of an $Al_xGa_{1-x}N$ layer (where $0<x<1$) and an $Al_xIn_yGa_{1-x-y}N$ layer (where $0<x<=y<1$, $0<x+y<1$) in which a band gap is smaller than that of the barrier layer are placed by turns; and
a p-type semiconductor layer placed on the active layer, and composed of an $Al_xGa_{1-x}N$ layer (where $0<=x<1$) that is doped with a p-type impurity.

12. The semiconductor light emitting device according to claim 11, wherein the protective film having the window section is placed on the substrate, and the n-type semiconductor layer is placed also on the protective film.

13. The semiconductor light emitting device according to claim 12, wherein the p-type semiconductor layer comprises:
an electron barrier layer placed on the active layer, and composed of an $Al_xGa_{1-x}N$ layer (where $0<=x<1$) doped with a p-type impurity;
an electron cap layer placed on the electron barrier layer, and composed of an $Al_xGa_{1-x}N$ layer (where $0<=x<1$) doped with a p-type impurity;
a first nitride based semiconductor layer placed on the electron cap layer, and composed of an $Al_xGa_{1-x}N$ layer (where $0<=x<1$) doped with a p-type impurity;
a second nitride based semiconductor layer placed on the first nitride based semiconductor layer, and composed of an $Al_xGa_{1-x}N$ layer (where $0<=x<1$) doped with a low-concentration p-type impurity having a concentration that is lower than that of the p-type impurity of the first nitride based semiconductor layer;
a third nitride based semiconductor layer placed on the second nitride based semiconductor layer, and composed of an $Al_xGa_{1-x}N$ layer (where $0<=x<1$) doped with a high-concentration p-type impurity having a concentration that is higher than that of the p-type impurity of the second nitride based semiconductor layer; and
a fourth nitride based semiconductor layer placed on the third nitride based semiconductor layer, and composed of an $Al_xGa_{1-x}N$ layer (where $0<=x<1$) doped with a low-concentration p-type impurity having a concentration that is lower than that of the p-type impurity of the third nitride based semiconductor layer.

14. The semiconductor light emitting device according to claim 5, wherein the n-type semiconductor layer is formed by epitaxial growth of the n-type semiconductor layer from the window section of the protective film.

15. The semiconductor light emitting device according to claim 5, wherein a block layer is placed between the active layer and the p-type semiconductor layer.

16. The semiconductor light emitting device according to claim 1, wherein the substrate includes a material different than any material included in the protective film.

* * * * *